United States Patent
Yokote et al.

(10) Patent No.: US 11,331,993 B2
(45) Date of Patent: May 17, 2022

(54) TEMPERATURE CONDITIONING UNIT, TEMPERATURE CONDITIONING SYSTEM, AND VEHICLE

(71) Applicant: Panasonic Intellectual Property Management Co., Ltd., Osaka (JP)

(72) Inventors: Shizuka Yokote, Osaka (JP); Taku Uno, Osaka (JP); Takashi Ogawa, Osaka (JP); Sho Koyama, Hyogo (JP); Michihiro Kurokawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 591 days.

(21) Appl. No.: 16/468,567

(22) PCT Filed: Dec. 14, 2017

(86) PCT No.: PCT/JP2017/044814
§ 371 (c)(1),
(2) Date: Jun. 11, 2019

(87) PCT Pub. No.: WO2018/116942
PCT Pub. Date: Jun. 28, 2018

(65) Prior Publication Data
US 2020/0091572 A1    Mar. 19, 2020

(30) Foreign Application Priority Data

Dec. 21, 2016    (JP) .............................. JP2016-247939

(51) Int. Cl.
*B60K 1/04*    (2019.01)
*H01M 10/613*    (2014.01)
(Continued)

(52) U.S. Cl.
CPC .............. *B60K 1/04* (2013.01); *F04D 27/004* (2013.01); *F04D 29/281* (2013.01);
(Continued)

(58) Field of Classification Search
CPC .... H02K 9/06; H02K 5/20; G06F 1/20; F04D 27/004; F04D 29/281; F04D 25/06;
(Continued)

(56) References Cited

U.S. PATENT DOCUMENTS 4,126,269 A * 11/1978 Bruges ..................... F24F 11/76
374/176
5,440,450 A * 8/1995 Lau ........................... G06F 1/20
361/695
(Continued)

FOREIGN PATENT DOCUMENTS

JP    2007-008443    1/2007
JP    2015-012628    1/2015
(Continued)

OTHER PUBLICATIONS

International Search Report of PCT application No. PCT/JP2017/044814 dated Feb. 20, 2018.
(Continued)

*Primary Examiner* — Adam B Dravininkas
(74) *Attorney, Agent, or Firm* — McDermott Will & Emery LLP

(57) ABSTRACT

A temperature conditioning unit includes a first temperature conditioning unit part, a second temperature conditioning unit part, and a blower (centrifugal blower). The first temperature conditioning unit part includes a first housing, a first air hole part, a first air chamber, a first object to be temperature-conditioned, and a second air chamber. The second temperature conditioning unit part includes a second
(Continued)

housing, a second object to be temperature-conditioned, a second air hole part, and a third air chamber.

18 Claims, 26 Drawing Sheets

(51) Int. Cl.
| | |
|---|---|
| *H01M 10/615* | (2014.01) |
| *H01M 10/625* | (2014.01) |
| *H01M 10/6556* | (2014.01) |
| *H01M 10/6563* | (2014.01) |
| *H01M 10/667* | (2014.01) |
| *F04D 27/00* | (2006.01) |
| *F04D 29/28* | (2006.01) |
| *H05K 7/20* | (2006.01) |
| *F04D 25/06* | (2006.01) |

(52) U.S. Cl.
CPC ....... *H01M 10/613* (2015.04); *H01M 10/615* (2015.04); *H01M 10/625* (2015.04); *H01M 10/6556* (2015.04); *H01M 10/6563* (2015.04); *H01M 10/667* (2015.04); *H05K 7/20172* (2013.01); *H05K 7/20209* (2013.01); *H05K 7/20863* (2013.01); *F04D 25/06* (2013.01); *H01M 2220/20* (2013.01)

(58) Field of Classification Search
CPC .............. F04D 29/4226; F04D 19/002; H01M 10/613; H01M 10/615; H01M 10/625; H01M 10/6556; H01M 10/6563; H01M 10/667; H01M 2220/20; H01M 10/6566; H05K 7/20145; H05K 7/20209; H05K 7/20863; H05K 7/20572; H05K 7/20136
See application file for complete search history.

(56) References Cited

U.S. PATENT DOCUMENTS

| | | | |
|---|---|---|---|
| 5,796,580 A * | 8/1998 | Komatsu | H05K 7/20727 361/679.48 |
| 2007/0131220 A1* | 6/2007 | Kim | H05B 6/642 126/273 R |
| 2008/0196957 A1 | 8/2008 | Koike et al. | |
| 2008/0247135 A1* | 10/2008 | Inoue | H01M 50/20 361/695 |
| 2008/0280192 A1* | 11/2008 | Drozdz | H01M 10/6566 700/297 |
| 2015/0280520 A1* | 10/2015 | Hümer | H02K 5/24 310/59 |
| 2015/0325891 A1* | 11/2015 | Inoue | H01M 50/502 180/68.1 |
| 2015/0357614 A1 | 12/2015 | Sohn et al. | |
| 2016/0001633 A1* | 1/2016 | Nishio | H05B 3/145 219/202 |
| 2016/0037984 A1* | 2/2016 | Park | F04D 29/626 15/326 |
| 2017/0096079 A1 | 4/2017 | Yokote et al. | |

FOREIGN PATENT DOCUMENTS

| | | |
|---|---|---|
| WO | 2015/190077 | 12/2015 |
| WO | 2017/051521 A1 | 3/2017 |

OTHER PUBLICATIONS

The Extended European Search Report dated Dec. 4, 2019 for the related European Patent Application No. 17883922.1.

\* cited by examiner

FORWARD FAN

BACKWARD FAN (OPENING FORMED IN FAN CASE OF BLOWER)

TEMPERATURE CONDITIONING UNIT, TEMPERATURE CONDITIONING SYSTEM, AND VEHICLE

CROSS-REFERENCE TO RELATED APPLICATIONS

This application is a U.S. national stage application of PCT International Application No. PCT/JP2017/044814 filed on Dec. 14, 2017, which claims the benefit of foreign priority of Japanese patent application 2016-247939 filed on Dec. 21, 2016, the contents all of which are incorporated herein by reference.

TECHNICAL FIELD

The present invention relates to a temperature conditioning unit, a temperature conditioning system, and a vehicle on which the temperature conditioning unit or the temperature conditioning system is mounted.

BACKGROUND ART

A power storage device such as a secondary battery and a power conversion device such as an inverter or a converter (such devices are collectively referred to as an object to be temperature-conditioned hereinafter) generate heat due to internal resistance and external resistance, when an electric current flows therethrough. When the temperature of the object to be temperature-conditioned becomes excessively high, the performance of the object to be temperature-conditioned cannot be sufficiently exhibited. When the object to be temperature conditioned is used in an area where the ambient temperature is extremely low such as in a cold area, the performance of the object to be temperature-conditioned cannot also be sufficiently exhibited. That is, the temperature of the object to be temperature-conditioned greatly affects output characteristics or power conversion characteristics of the object to be temperature-conditioned and the life of the object to be temperature conditioned.

The object to be temperature-conditioned can be mounted on a hybrid vehicle, an electric vehicle (EV), and the like. The installation area of the object to be temperature-conditioned is limited for ensuring an interior space of the vehicle. Therefore, cells constituting a secondary battery are placed in close contact with each other in a housing for storing the cells, and thus, it is hard for the cells to dissipate heat. Likewise, the power conversion device is placed under an environment where it is hard for the power conversion device to dissipate heat. Further, the hybrid vehicle, the EV, and other vehicles are demanded to be usable in a wide temperature range. The object to be temperature-conditioned mounted on the hybrid vehicle, the EV, and other vehicles is also demanded to be operable in a wide temperature range.

In PTL 1, gas is forcibly supplied to the inside of a housing which accommodates an object to be temperature-conditioned using an intake and exhaust device (blower) so that the temperature in the housing is adjusted to be suitable for an output of a secondary battery and an operation of a power conversion device. Recently, a secondary battery mounted on a hybrid vehicle is demanded to be downsized and to have a higher output. Heating a secondary battery and a power conversion device and heat dissipation therefrom become an increasingly significant problem.

Nowadays, a temperature conditioning unit or the like mounted on, for example, a hybrid vehicle or an electric vehicle houses a plurality of objects to be temperature-conditioned and a partition wall or a partition plate disposed around each of the objects to be temperature-conditioned. When the objects housed in the temperature conditioning unit are densely disposed, pressure resistance of the entire temperature conditioning unit increases. That is, a load on the blower increases, resulting in that it is necessary for the blower to have a larger output. Thus, there is demand to further improve the performance of the temperature conditioning unit by a blower having appropriate blowing characteristics and optimization of an operating point of the blower.

CITATION LIST

Patent Literature

PTL 1: Unexamined Japanese Patent Publication No. 2015-012628

SUMMARY OF THE INVENTION

The present invention aims to provide a novel temperature conditioning unit that can provide preferable cooling and heating even when the pressure resistance of the entire temperature conditioning unit increases due to an increase in density of objects housed in the temperature conditioning unit.

To address the abovementioned problem, the inventors of the present application have made earnest studies through trial and error. The detail thereof will be described below.

To address the problem, the temperature conditioning unit according to the present invention is a temperature conditioning unit including a first temperature conditioning unit part, a second temperature conditioning unit part, and a blower. The first temperature conditioning unit part includes a first housing, a first air hole part, a first air chamber, a first object to be temperature-conditioned, and a second air chamber. The second temperature conditioning unit part includes a second housing, a second object to be temperature-conditioned, a second air hole part, and a third air chamber. The temperature conditioning unit includes: a partition wall formed such that a part of a wall of the first housing serves as a part of a wall of the second housing or a partition wall formed such that a part of the wall of the second housing serves as a part of the wall of the first housing; a structure for connecting an air intake hole of the blower and the second air chamber so as to allow passage of air; a structure for disposing an outlet hole of the blower and the third air chamber so as to allow passage of air; a structure for disposing a part of the second object to be temperature-conditioned inside the third air chamber; and a structure for disposing a part of the blower inside the third air chamber. The blower includes: an impeller disk that has a rotary shaft at a central portion and a surface extending in a direction intersecting the rotary shaft; an impeller that has a plurality of rotor blades, each of the rotor blades extending in a direction along the rotary shaft, having a circular-arc cross section in the direction intersecting the rotary shaft, and having an inner-periphery-side end positioned closer to the rotary shaft and an outer-periphery-side end positioned on an opposite side from the rotary shaft, the circular-arc cross section protruding in a direction of rotation of the impeller disk; an electric motor that includes a shaft and that transmits a rotary motion to the rotary shaft through the shaft; a fan case that has a side wall extending in a longitudinal direction of the rotary shaft so as to cover the impeller and the air intake hole positioned in the longitudinal direction of the rotary shaft; and an outlet hole corresponding to the air intake hole. The fan case has a flow path for guiding, toward the outlet hole along the side wall, air that is suctioned through the air intake hole and flows toward the outer-periphery-side end from the inner-periphery-side end due to rotation of the impeller by the rotary motion transmitted from the electric motor.

In the temperature conditioning unit according to the present invention, the fan case of the blower is configured to have an elliptical shape, not a cylindrical shape symmetric with respect to the rotary shaft. If the fan case of the blower is formed into a cylindrical shape when a space where the blower is installed is narrow, a sufficient flow path area cannot be ensured, and the blower may not sufficiently exhibit its performance. In such a case, the fan case is formed to have an elliptical shape or a substantially polygonal shape such as a substantially triangular shape. Thus, a narrow space can be effectively used. Therefore, the flow path area of the blower can be increased. Accordingly, an output of the blower can be increased.

In the temperature conditioning unit according to the present invention, an edge line of the fan case of the blower is not on a plane perpendicular to the rotary shaft of a fan, and thus, a portion in proximity to the second object to be temperature-conditioned is short in a height direction. With this configuration, a radial component of a flow of air discharged from the blower is increased at the portion of the fan case which is short in the height direction, whereby air can be blown to the second object to be temperature-conditioned. Accordingly, an effect of cooling the second object to be temperature-conditioned can be improved. A shape formed by cutting the fan case along a plane angled with respect to the rotary shaft of the fan is described as a shape in which the fan case is decreased in height at any position. However, such a shape may be a partial cutout. A preferable shape can be selected. The fan case of the blower according to the present invention has an outlet hole in a part of a side wall located close to the second object to be temperature-conditioned. With this configuration, a portion of air flowing into the fan can be discharged through the outlet hole and blown to the second object to be temperature-conditioned. Accordingly, an effect of cooling the second object to be temperature-conditioned can be improved. The shape of the outlet hole formed in the side wall of the fan case may be a circular, elliptical, polygonal, or the like.

The present invention can provide a temperature conditioning unit that can provide preferable cooling and heating even when the pressure resistance of the entire temperature conditioning unit increases due to an increase in density of objects housed in the temperature conditioning unit.

DESCRIPTION OF EMBODIMENTS

A temperature conditioning unit according to an exemplary embodiment of the present invention can efficiently blow air to a first housing that houses densely disposed components, due to configurations described below. The temperature conditioning unit can also blow air to a second housing. With this configuration, temperature rise in the second housing can be prevented. Thus, the temperature conditioning unit according to the exemplary embodiment of the present invention is compact and can be achieved by a simple configuration.

Specifically, a conventional temperature conditioning unit has the following problems to be improved. When temperature conditioning of a plurality of independent objects to be temperature-conditioned is performed by the conventional temperature conditioning unit using a blower, an object to be temperature-conditioned which is not directly connected to the blower may have an area where a flow velocity is low. Therefore, the temperature conditioning may not be sufficiently performed. This is because a plurality of objects to be temperature-conditioned which is communicated with each other is disposed only on an intake side or discharge side of the blower. In addition, a flow path is narrowed and a direction of flow is complicated in a region where the objects to be temperature-conditioned are communicated with each other. Therefore, pressure resistance of the entire temperature conditioning unit is increased. That is, a load on the blower increases, resulting in that it is necessary for the blower to have a larger output.

Exemplary embodiments of the present invention will be described below with reference to the accompanying drawings. It should be noted that the following exemplary embodiments are merely examples of embodying the present invention, and not intended to limit the technical scope of the present invention.

First Exemplary Embodiment

Figure 1A:
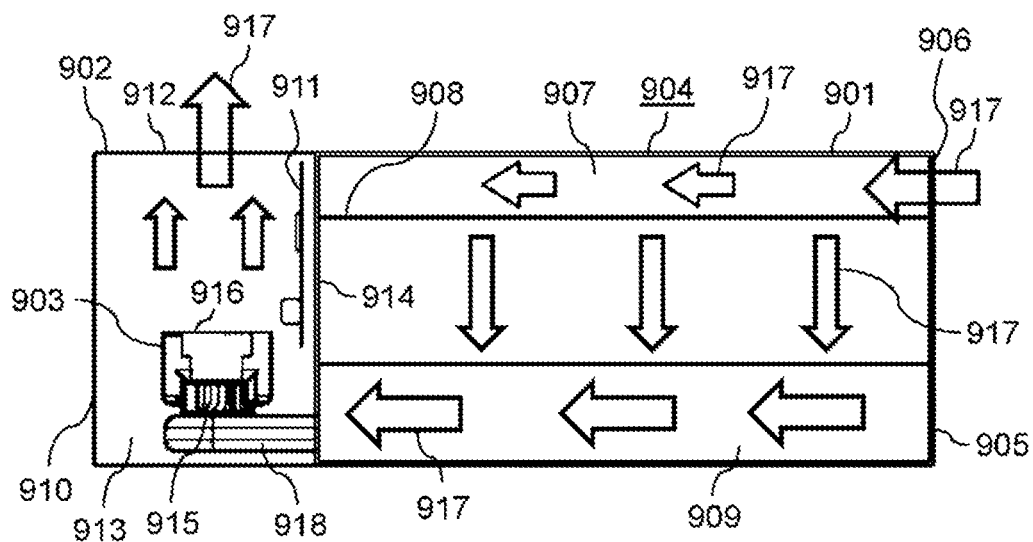
FIG. 1A is a schematic view illustrating a temperature conditioning unit according to a first exemplary embodiment.
Figure 1B:
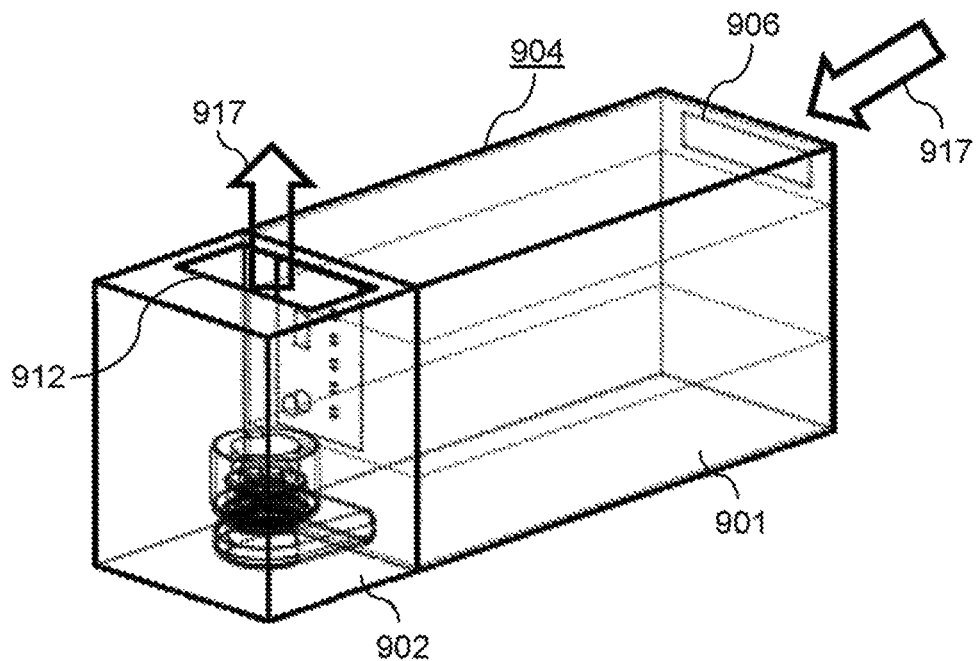
FIG. 1B is a perspective view illustrating the temperature conditioning unit according to the first exemplary embodiment.
Figure 1C:
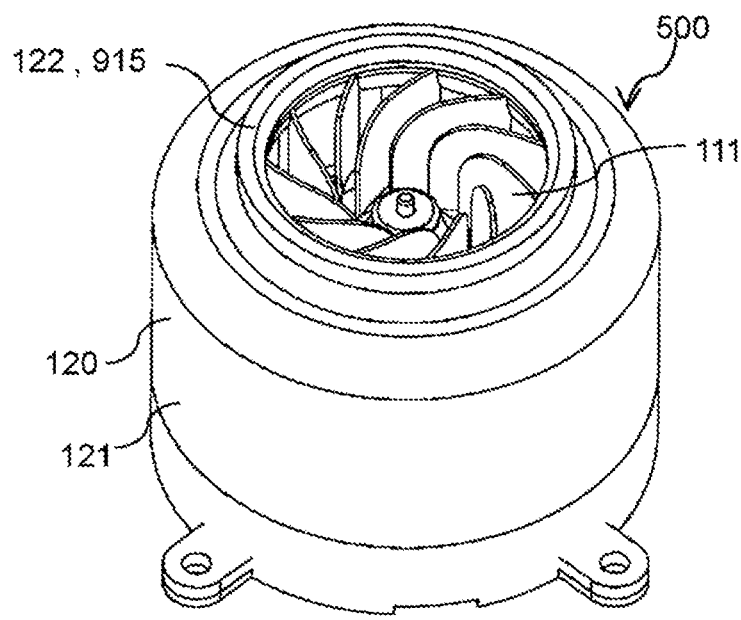
FIG. 1C is a perspective view schematically illustrating a blower (centrifugal blower) illustrated in FIGS. 1A and 1B.
Figure 1D:
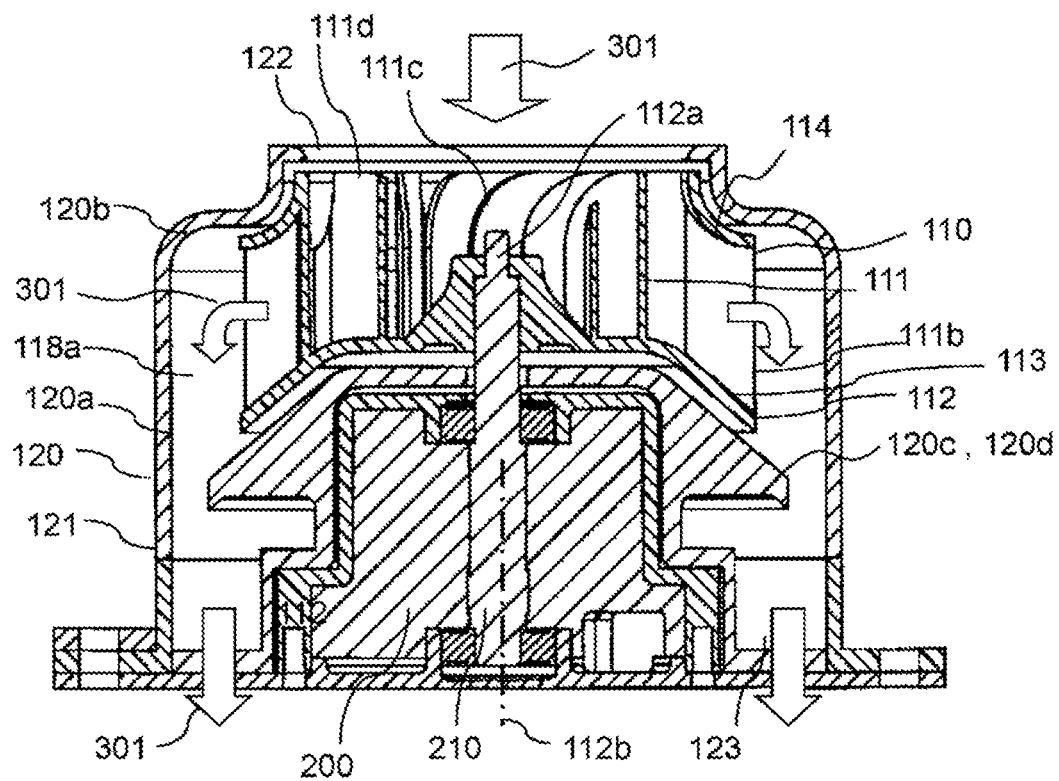
FIG. 1D is a sectional view schematically illustrating the blower (centrifugal blower) illustrated in FIGS. 1A and 1B.

FIG. 1A is a schematic view illustrating a temperature conditioning unit according to a first exemplary embodiment. FIG. 1B is a perspective view illustrating the temperature conditioning unit according to the first exemplary embodiment. FIG. 1C is a perspective view illustrating a blower (centrifugal blower). FIG. 1D is a sectional view illustrating the blower (centrifugal blower) illustrated in FIG. 1C.

Temperature conditioning unit 904 in the first exemplary embodiment includes first temperature conditioning unit part 901, second temperature conditioning unit part 902, and blower (centrifugal blower) 903. First temperature conditioning unit part 901 includes first housing 905, first air hole part 906, first air chamber 907, first object to be temperature-conditioned 908, and second air chamber 909. Second temperature conditioning unit part 902 includes second housing 910, second object to be temperature-conditioned 911, second air hole part 912, and third air chamber 913. Temperature conditioning unit 904 includes partition wall 914 formed such that a part of a wall of first housing 905 serves as a part of a wall of second housing 910 or partition wall 914 formed such that a part of the wall of second housing 910 serves as a part of the wall of first housing 905. Temperature conditioning unit 904 has air path 918 for connecting air intake hole 915 of blower (centrifugal blower) 903 and second air chamber 909 so as to allow passage of air, a structure for disposing outlet hole 916 of blower 903 and third air chamber 913 so as to allow passage of air, a structure for disposing at least a part of second object to be temperature-conditioned 911 inside third air chamber 913, and a structure for disposing at least a part of blower (centrifugal blower) 903 inside third air chamber 913. Blower 903 includes: impeller disk 112 that has rotary shaft 112a at a central portion and a surface extending in a direction intersecting rotary shaft 112a; impeller 110 having a plurality of rotor blades 111, each of which extends in a direction along rotary shaft 112a, has a circular-arc cross section in a direction intersecting rotary shaft 112a, and has inner-periphery-side end 111a positioned closer to rotary shaft 112a and outer-periphery-side end 111b positioned on an opposite side from rotary shaft 112a, the circular-arc cross section protruding in a direction of rotation of impeller disk 112; an electric motor that includes shaft 210 and that transmits a rotary motion to rotary shaft 112a through shaft 210; fan case 120 (see FIGS. 1C and 1D) that has a side wall extending in a longitudinal direction of rotary shaft 112a so as to cover impeller 110 and air intake hole 915 positioned in the longitudinal direction of rotary shaft 112a; and outlet hole 123 (see FIGS. 1C and 1D) corresponding to air intake hole 915. Fan case 120 has flow path 118a (see FIG. 1D) for guiding, toward outlet hole 123 (see FIG. 1D) along side wall 121 (see FIG. 1D), air that is suctioned through air intake hole 915 and flows toward outer-periphery-side end 111b (see FIG. 1D) from inner-periphery-side end 111a (see FIG. 1D) due to rotation of impeller 110 by a rotary motion transmitted from electric motor 200 (see FIG. 1D).

As illustrated in FIGS. 1A and 1B, temperature conditioning unit 904 according to the first exemplary embodiment is provided with impeller 110, blower (centrifugal blower) 903, fan case 120, first housing 905, second housing 910, first temperature conditioning unit part 901, and second temperature conditioning unit part 902.

As illustrated in FIGS. 1C and 1D, impeller 110 has impeller disk 112 and a plurality of rotor blades 111.

Figure 1E:
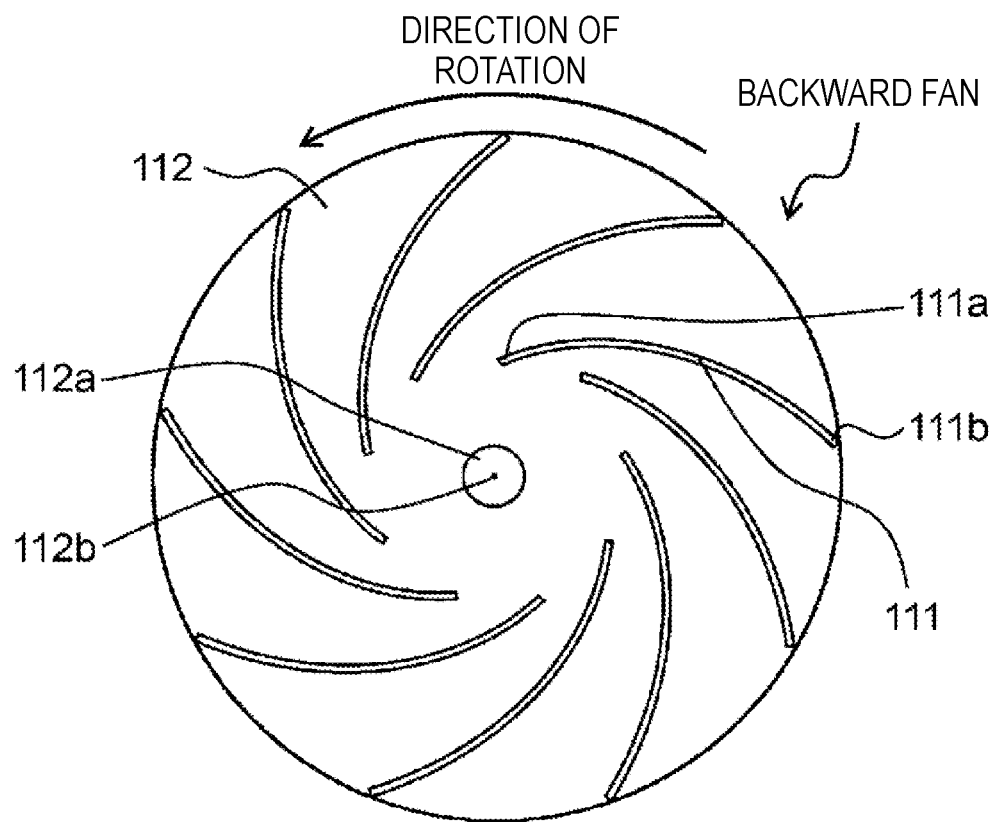
FIG. 1E is a schematic explanatory view for describing an impeller according to the first exemplary embodiment.

As illustrated in FIG. 1E, impeller disk 112 has rotary shaft 112a on its center. Impeller disk 112 has a surface extending in a direction intersecting rotary shaft 112a. The plurality of rotor blades 111 extends in a direction along rotary shaft 112a. As illustrated in FIG. 1E, each of the plurality of rotor blades 111 has a circular-arc cross section in a direction intersecting rotary shaft 112a, the circular-arc cross section protruding in the direction of rotation of impeller disk 112. Each of the plurality of rotor blades 111 has inner-periphery-side end 111a positioned closer to rotary shaft 112a and outer-periphery-side end 111b positioned on an opposite side from rotary shaft 112a.

As illustrated in FIG. 1A, blower (centrifugal blower) 903 has shaft 210. Blower (centrifugal blower) 903 transmits a rotary motion to rotary shaft 112a via shaft 210.

Fan case 120 is configured to cover impeller 110. Fan case 120 has side wall 121, air intake hole 915, outlet hole 123, and flow path 118a. Side wall 121 is formed along rotary shaft 112a. Air intake hole 915 is positioned in the direction of axis 112b of rotary shaft 112a. Outlet hole 123 is positioned opposite to air intake hole 915 with respect to side wall 121 in the direction along rotary shaft 112a. When impeller 110 rotates by the rotary motion transmitted from blower (centrifugal blower) 903, air suctioned through air intake hole 915 and flowing from inner-periphery-side end 111a to outer-periphery-side end 111b flows into flow path 118a and is guided to outlet hole 1123 along side wall 121.

In FIG. 1A, airflow is indicated by arrow 917. Airflow 917 schematically indicates air flowing through temperature conditioning unit 904.

First object to be temperature-conditioned 908 such as a secondary battery is housed in first housing 905. Second object to be temperature-conditioned 911, such as a circuit board, an electronic component, a radiator, a relay, or a semiconductor element, is housed in second housing 910.

Specific configurations that can provide significant advantages and effects are as described below.

As illustrated in FIG. 1A, first housing 905 is provided adjacent to second housing 910. Blower (centrifugal blower) 903 is provided in a flow path that communicates first air chamber 907 with second air chamber 909. First air hole part 906 suctions air to be supplied to blower (centrifugal blower) 903 from the outside of temperature conditioning unit 904. Second air hole part 912 discharges air discharged from blower (centrifugal blower) 903 to the outside of temperature conditioning unit 904.

As illustrated in FIG. 1C, impeller 110 of blower (centrifugal blower) 903 has shroud 114. Shroud 114 is positioned on the opposite side of impeller disk 112 with respect to the plurality of rotor blades 111. As illustrated in FIG. 1D, shroud 114 is connected to ends-opposite-to-impeller-disk 111c of respective rotor blades 111.

Shroud 114 has opening 111d formed at a position facing the air intake hole. A distance between shroud 114 and impeller disk 112 in the direction along rotary shaft 112a is shorter at a portion closer to outer-periphery-side end 111b than at a portion closer to inner-periphery-side end 111a.

The secondary battery serving as an object to be temperature-conditioned includes a secondary battery to be used in a vehicle.

The temperature conditioning unit will be described in more detail with reference to the drawings.

As illustrated in FIGS. 1C and 1D, blower (centrifugal blower) 903 has impeller 110 and fan case 120.

Impeller 110 is configured such that the plurality of rotor blades 111 is provided on impeller disk 112 having a substantially disk shape. Fan case 120 has side wall 1121 and air intake hole 915. Side wall 1121 is a substantially cylindrical side surface extending in the direction of axis 112b of rotary shaft 112a included in impeller 110. Air intake hole 915 is positioned in the direction of axis 112b. Air intake hole 915 is circularly opened around axis 112b in a surface intersecting the direction of axis 112b.

Impeller 110 is connected to electric motor 200 serving as a rotary drive source via shaft 210.

As illustrated in FIGS. 1D to 1D, air intake hole 915 of blower (centrifugal blower) 903 and second air chamber 909 of first housing 905 are connected to each other with a duct.

When electric motor 200 serving as a rotary drive source rotates, impeller 110 rotates through shaft 210. When impeller 110 rotates, air flows in through air intake hole 915 formed in fan case 120. Air flowing in through air intake hole 915 is given energy from rotor blades 111. The air having been given energy from rotor blades 111 is discharged in a direction substantially perpendicular to rotary shaft 112a along impeller disk 112.

The air discharged from impeller 110 changes its direction and flows toward outlet hole 1123 along an inner wall surface of fan case 120. The inner wall surface of fan case 120 preferably has a gently curved surface so as not to interfere with airflow 917.

The air discharged through outlet hole 123 of fan case 120 flows into second air chamber 909, cools second object to be temperature-conditioned 911 placed in third air chamber 913 of second temperature conditioning unit part 902, and is discharged through a third air hole part. The air intake hole of blower (centrifugal blower) 903 is connected to first air chamber 907. When blower (centrifugal blower) 903 suctions air, the pressure in first air chamber 907 decreases. Thus, air flows in through second air hole part 912, cools or heats the secondary battery serving as the first object to be temperature-conditioned through second air chamber 909, flows through first air chamber 907, and then, is suctioned by blower (centrifugal blower) 903.

Second air hole part 912 is one or a plurality of openings formed in any portion of second housing 910 as appropriate.

A dust-proof air filter may be provided to first air hole part 906 and second air hole part 912. Further, a dehumidification device may be attached to first air hole part 906 and second air hole part 912.

As illustrated in FIG. 1D, impeller 110 has impeller disk 112 and the plurality of rotor blades 111. Impeller disk 112 is formed into a substantially disk shape in a plane perpendicular to rotary shaft 112a. Rotary shaft 112a is connected to shaft 210 of the electric motor serving as a rotary drive source. The plurality of rotor blades 111 is provided to impeller disk 112 on one surface facing the air intake hole.

As illustrated in FIG. 1C, impeller 110 in the first exemplary embodiment has shroud 114. Shroud 114 is mounted so as to cover ends-opposite-to-impeller-disk 111c of respective rotor blades 111 on the air intake hole side. Shroud 114 is an annular plate member.

Figure 1F:
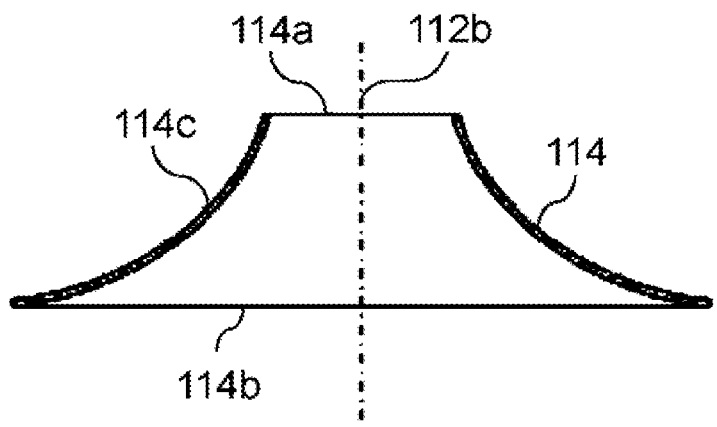
FIG. 1F is an explanatory view for describing a shroud included in the impeller illustrated in FIG. 1C.

As illustrated in FIG. 1F, shroud 114 has a funnel shape or a tapered shape.

More specifically, shroud 114 has two openings in the direction of axis 112b of rotary shaft 112a. Opening 114a on the air intake hole side is narrower than opening 114b facing impeller disk 112.

Opening 114a and opening 114b are connected to each other by side surface 114c. In the first exemplary embodiment, the cross-sectional shape of side surface 114c including axis 112b is curved to project toward axis 112b. The cross-section of side surface 114c including axis 112b may be linear in order to obtain desired performance.

Fan case 120 may further have inner wall surface 120a which constitutes a portion of flow path 118a and which faces impeller 110. Inner wall surface 120a may have curved part 120b curving such that an extension line intersects the axis of the rotary shaft at an acute angle in a plane including the axis, the extension line extending from a line connecting a portion in proximity to outer-periphery-side end 111b and an edge of outlet hole 123.

Flow path 118a may further have guide surface 120c positioned to face inner wall surface 120a. Guide surface 120c may have inclined part 120d that is inclined in the direction of the axis within a range from the portion in proximity to outer-periphery-side end 111b to outlet hole 1123.

Impeller 110 may further have shroud 114 which is positioned on the opposite side of impeller disk 112 with respect to the plurality of rotor blades 111, and which is connected to ends-opposite-to-impeller-disk 111c of respective rotor blades 111. Shroud 114 may have an opening at a position facing air intake hole 915, and the distance between shroud 114 and impeller disk 112 in the direction along the rotary shaft may be shorter at a portion closer to outer-periphery-side end 111a than at a portion closer to inner-periphery-side end 111b.

Comparative Example

Figure 2A:
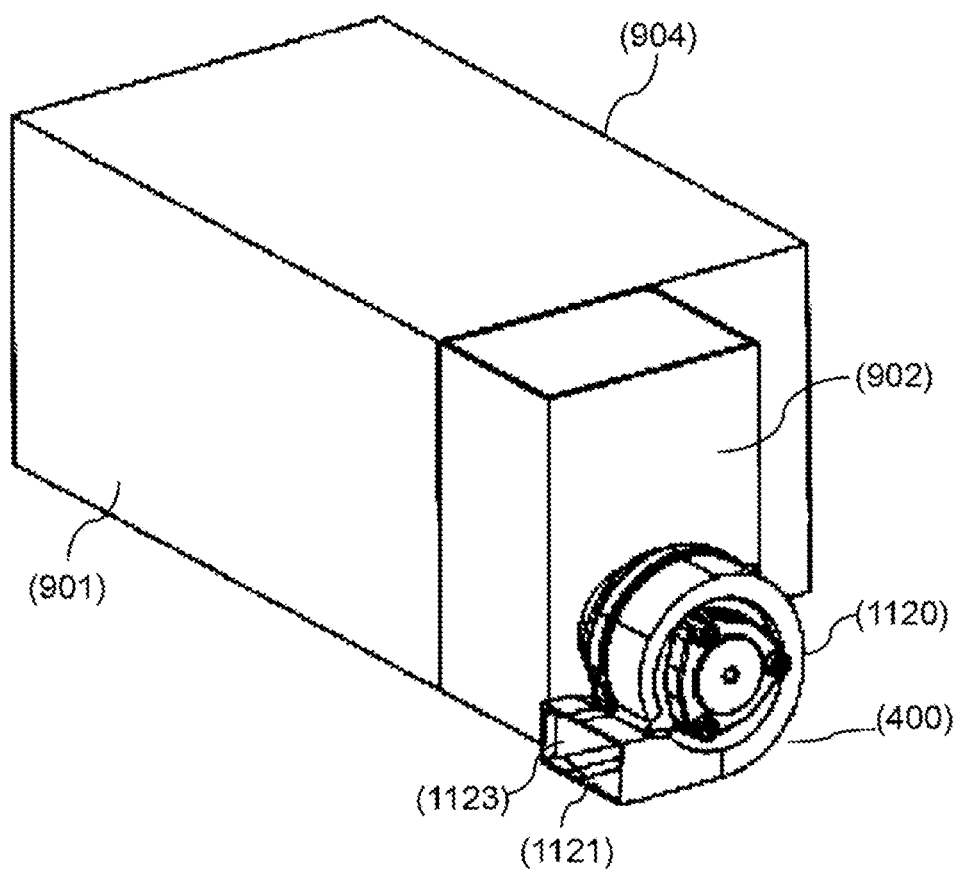
FIG. 2A is a schematic view illustrating a temperature conditioning unit according to a comparative example.
Figure 2B:
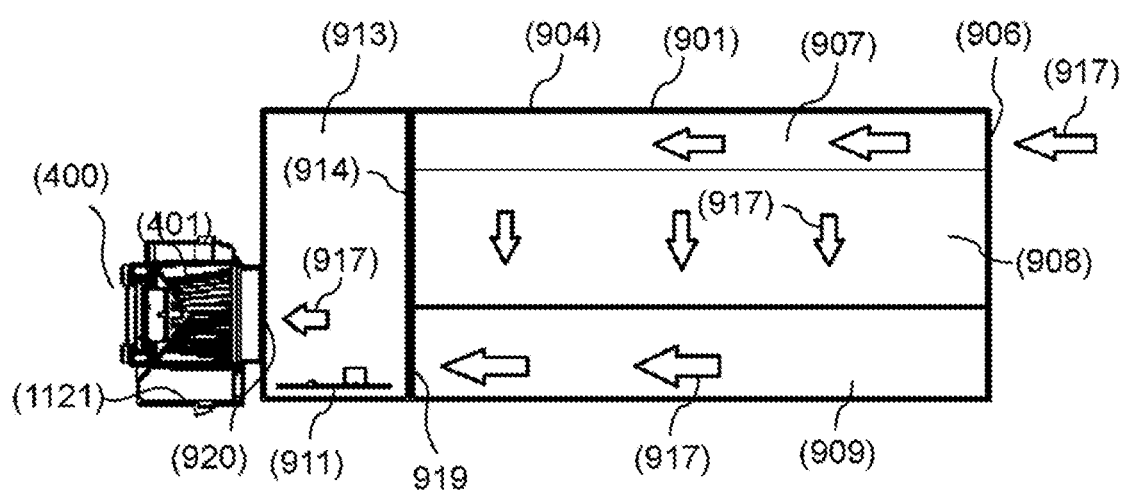
FIG. 2B is a schematic view illustrating the temperature conditioning unit according to the comparative example.

FIGS. 2A and 2B illustrate a temperature conditioning unit which is one example of conventional devices according to a comparative example. A schematic configuration of the comparative example will be described below. First, the configuration of the comparative example will be described in comparison with the first exemplary embodiment.

In temperature conditioning unit 904 in the comparative example, first temperature conditioning unit 901 and second temperature conditioning unit 902 are adjacent to each other via partition wall 914 serving as first housing 905. Partition wall 914 is formed with communication hole 919. First housing 905 has air intake hole 906 through which air is taken in from the outside, and the second housing has discharge hole 920 connected to blower (sirocco fan) 400. Air is discharged by blower (sirocco fan) 400. Blower (sirocco fan) 400 in temperature conditioning unit 904 in the comparative example has fan case 1120.

Forward fan 401 is mounted inside fan case 1120. Forward fan 401 is also called a sirocco fan in terms of the structure of forward fan 401. Forward fan 401 discharges air, which is suctioned through communication hole 919 in contact with the second housing illustrated in FIGS. 2A and 2B, in the circumferential direction of forward fan 401. Airflow 917 discharged from forward fan 401 flows along side wall 1121 of fan case 1120 to reach outlet hole 1123. In the inside of fan case 1120 in the comparative example, the air discharged from forward fan 400 is integrated and accumulated along the circumferential direction. Fan case 1120 is configured such that the distance between side wall 1121 and the rotary shaft gradually increases.

Comparison Between First Exemplary Embodiment and Comparative Example

Figure 3:
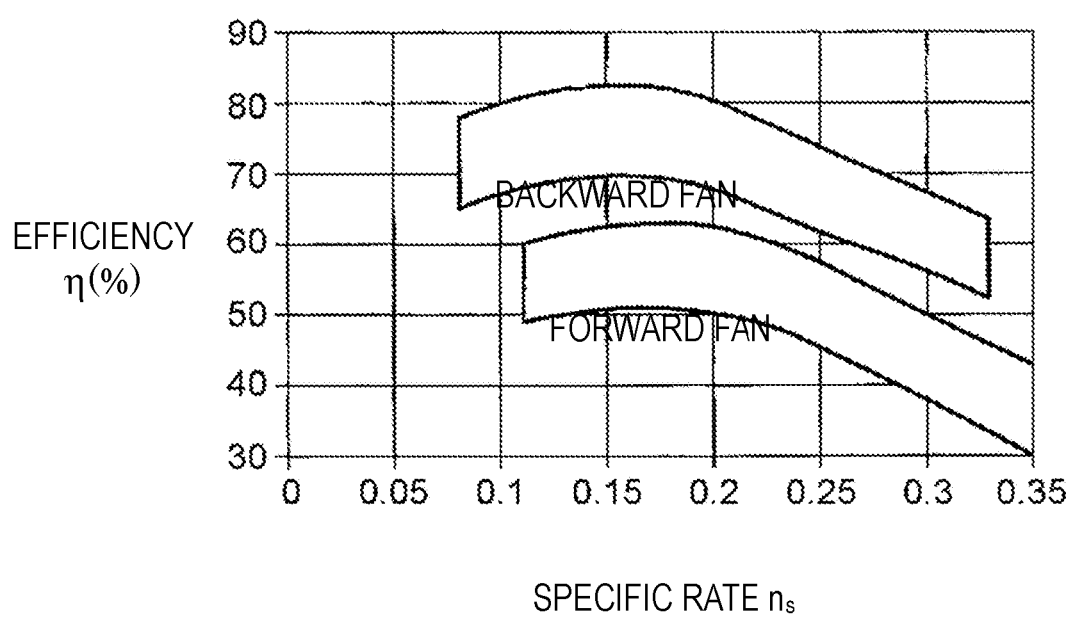
FIG. 3 is a graph showing efficiency characteristics of the impeller used in the temperature conditioning unit according to the first exemplary embodiment and those of an impeller used in the comparative example.
Figure 4:
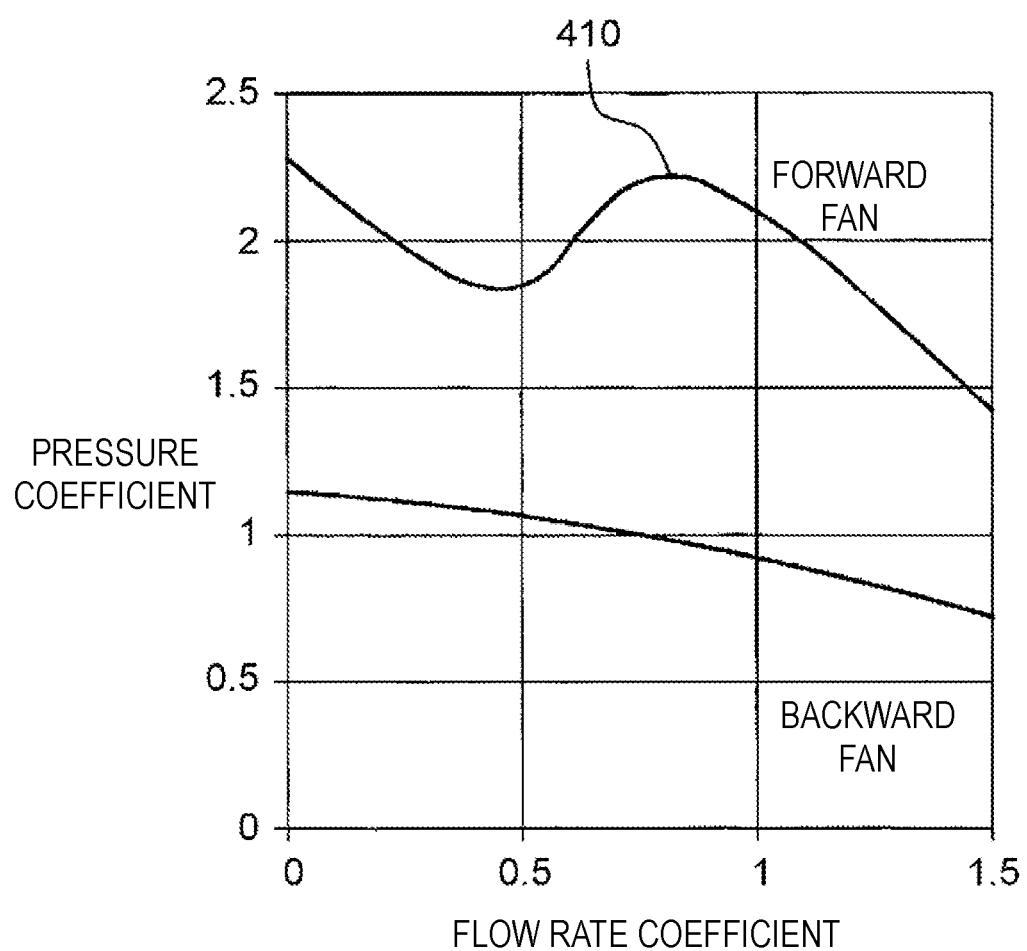
FIG. 4 is a graph showing a characteristic relationship between a flow coefficient and a pressure coefficient of the impeller used in the temperature conditioning unit according to the first exemplary embodiment and that of the impeller used in the comparative example.
Figure 5A:
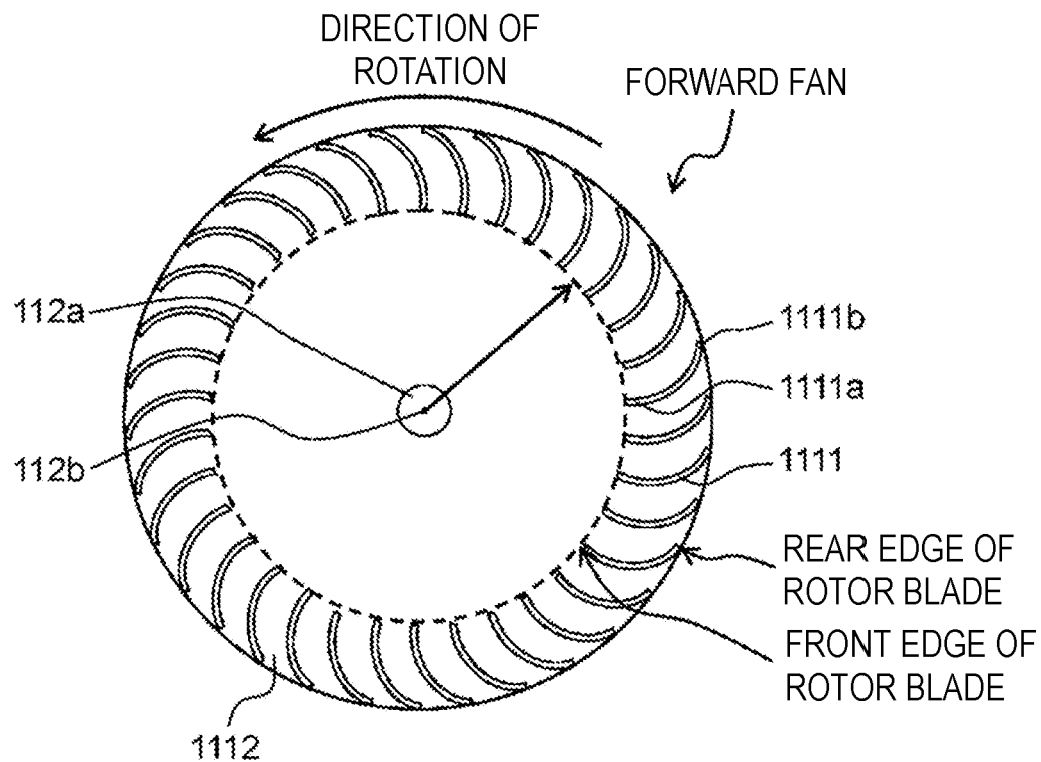
FIG. 5A is an explanatory view illustrating a shape of rotor blades of the impeller used in the temperature conditioning unit according to the comparative example.
Figure 5B:
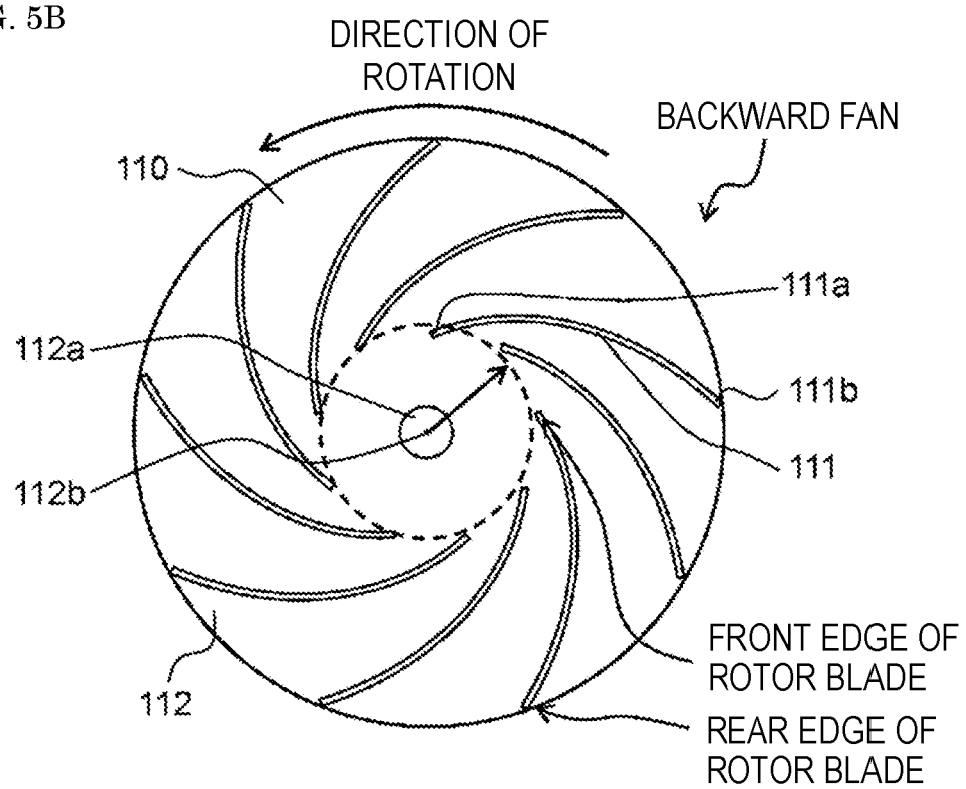
FIG. 5B is an explanatory view illustrating a shape of rotor blades of the impeller used in the temperature conditioning unit according to a second exemplary embodiment.
Figure 6A:
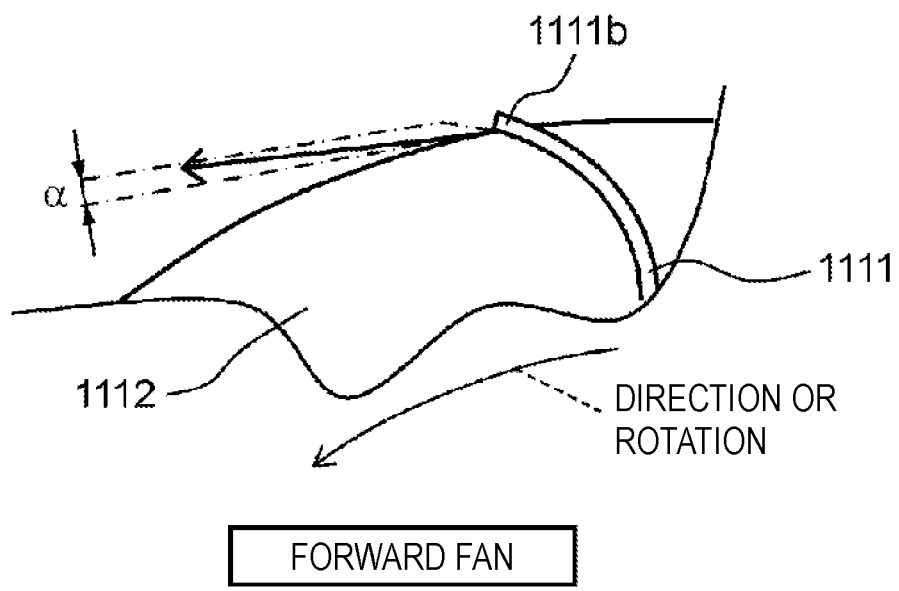
FIG. 6A is an enlarged view of a main part of each of the rotor blades illustrated in FIG. 5A.
Figure 6B:
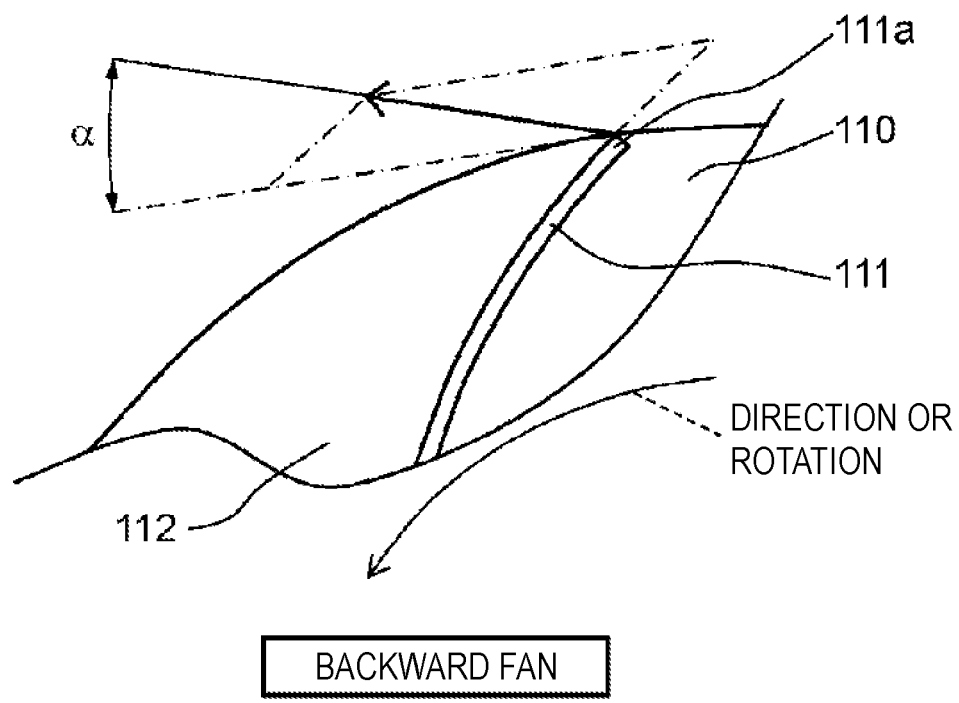
FIG. 6B is an enlarged view of a main part of each of the rotor blades illustrated in FIG. 5B.

FIG. 3 is a graph showing efficiency characteristics of the impeller used in the temperature conditioning unit according to the first exemplary embodiment and those of an impeller used in the comparative example. FIG. 4 is a graph showing a characteristic relationship between a flow coefficient and a pressure coefficient of the impeller used in the temperature conditioning unit according to the first exemplary embodiment and that of the impeller used in the comparative example. FIG. 5A is an explanatory view illustrating a shape of rotor blades of the impeller used in the temperature conditioning unit in the comparative example. FIG. 5B is an explanatory view illustrating a shape of the rotor blades of the impeller used in the temperature conditioning unit according to the first exemplary embodiment. FIG. 6A is an enlarged view of a main part of each of the rotor blades illustrated in FIG. 5A. FIG. 6B is an enlarged view of a main part of each of the rotor blades illustrated in FIG. 5B.

The temperature conditioning unit according to the first exemplary embodiment can be used to condition a temperature of an in-vehicle secondary battery serving as the first object to be temperature-conditioned. The temperature conditioning unit according to the first exemplary embodiment can also be used to condition a temperature of the second object to be temperature-conditioned, such as a circuit board, an electronic component, a radiator, a relay, or a semiconductor element. The in-vehicle secondary battery may be merely referred to as a secondary battery hereinafter.

The secondary battery is required to suppress a temperature rise associated with power output enhancement. The secondary battery which is a component mounted in a vehicle is also required to decrease an installation area. Therefore, the temperature conditioning unit needs to accommodate secondary batteries at high density inside the housing. When the mounting density of the secondary batteries in the housing increases, it is necessary to increase the output of the blower (centrifugal blower) in order to condition the temperature of the secondary batteries. Alternatively, it is necessary to increase a number of blowers (centrifugal blowers).

In the first exemplary embodiment, advantages of the temperature conditioning unit according to the first exemplary embodiment will be described through a comparison, to be described later, between a forward fan and a backward fan.

Description of Forward Fan and Backward Fan

FIG. 3 illustrates a relationship between specific rate $n_s$ and efficiency 4 of each of the forward and backward fans which constitute the respective impellers. The specific rate and the efficiency are dimensionless quantities. Specific rate $n_S$ is defined by the following equation (1).
[Equation 1]

$$\text{Specific rate } n_s = N \frac{\sqrt{Q}}{\left(\sqrt[4]{gH}\right)^3} \tag{1}$$

In Equation (1), N is a rotation speed, Q is a flow rate, g is gravity acceleration, and H is a head of the blade.

In general, the forward fan has a larger deceleration rate of relative speeds between the rotor blades, leading to a larger secondary flow loss. Accordingly, the forward fan is lower in efficiency than the backward fan.

FIG. 4 is a graph showing a relationship between a flow coefficient and a pressure coefficient of the forward fan of the impeller in the comparative example and that of the backward fan of the impeller in the temperature conditioning unit according to the first exemplary embodiment.

As shown in FIG. 4, the forward fan is higher in work coefficient than the backward fan. However, when operating at a lower flow rate, the forward fan has unstable region 410 where the characteristics vary. Specifically, in unstable region 410, the pressure coefficient decreases as indicated by a downward-sloping curve and then increases as indicated by an upward-sloping curve.

In contrast, the backward fan is lower in work coefficient than the forward fan. However, the backward fan, unlike the forward fan, has no unstable region where the characteristics vary. Accordingly, the backward fan can be stably used over the entire region of the flow coefficient, which allows high-speed rotation, resulting in higher output power.

FIGS. 5A and 5B illustrate a cross section of rotor blades of the forward fan in the comparative example, and a cross section of the backward fan adopted in the first exemplary embodiment, respectively, in a plane perpendicular to rotary shaft 112a of the corresponding fan. FIGS. 6A and 6B illustrate, for comparison, velocity triangles at rotor blade outlets of the forward fan and the backward fan, respectively.

As illustrated in FIGS. 5A and 6A, a circular-arc cross section of each of rotor blades 1111 in the forward fan in a direction intersecting rotary shaft 112a is recessed with respect to the direction of rotation of impeller disk 1112. In each of the plurality of rotor blades 1111, inner-periphery-side end 1111a positioned closer to rotary shaft 112a is positioned rearward of outer-periphery-side end 1111b positioned on a side opposite to rotary shaft 112a.

The output of the blower is represented by the following equation.

$$Pth = Y/g \times (U_2 \cdot Cu_2 \cdot U_1 \cdot Cu_1)$$

wherein pth is a theoretical total pressure,
Y is specific gravity of a fluid,
g is gravity acceleration,
$U_1$ is a circumferential velocity of the front edge of each rotor blade,
$U_2$ is a circumferential velocity of the rear edge of each rotor blade,
$Cu_1$ is a radial component of airflow flowing into the front edge of the rotor blade, and
$Cu_2$ is a radial component of airflow flowing out of the rear edge of the rotor blade.

As illustrated in FIGS. 5A and 5B, the forward fan has a smaller difference between a radius of the front edge and a radius of the rear edge, and therefore, it is hard for the forward fan to obtain a high total pressure. In contrast, in the backward fan, the length of each blade is larger, which leads to a greater difference between a radius of the front edge and a radius of a rear edge. Thus, the backward fan can provide a high total pressure.

Figure 7:
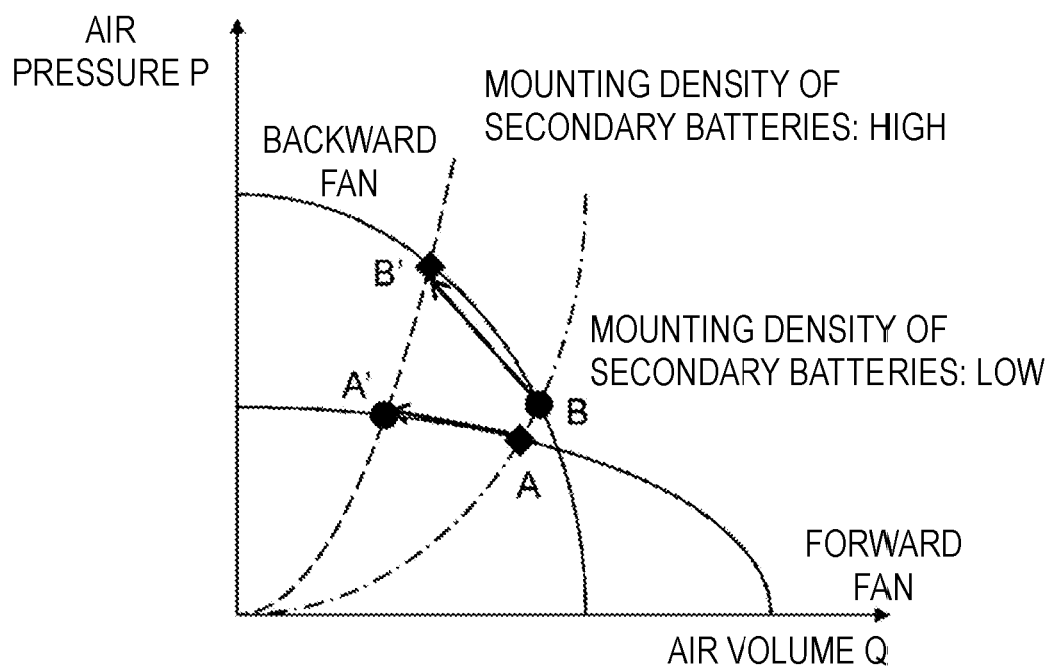
FIG. 7 is a graph showing a relationship between an air volume and an air pressure of the impeller used in the temperature conditioning unit according to the first exemplary embodiment and that of the impeller used in the comparative example.

FIG. 7 is a graph showing a relationship between an air volume and an air pressure of the impeller used in the temperature conditioning unit according to the first exemplary embodiment and that of the impeller used in the comparative example. As illustrated in FIG. 7, in the configuration using the forward fan, it is difficult to increase a static pressure by the fan alone. Therefore, in the configuration using the forward fan, a scroll casing is used, for example, to recover the static pressure by the fan case.

On the other hand, in the backward fan, the length of each rotor blade 111 is larger in the radial direction of impeller disk 112 as illustrated in FIG. 5B. Therefore, when impeller 110 rotates, a difference in velocity of flowing air is increased between inner-periphery-side end 111a which is an inlet of rotor blade 111 and outer-periphery-side end 111b which is an outlet of rotor blade 111. Accordingly, the backward fan can raise a static pressure by oneself as illustrated in FIG. 7. Thus, when the temperature conditioning unit according to the present exemplary embodiment is used, an air volume can be ensured, even if a total pressure loss of both the first object to be temperature-conditioned and the second object to be temperature-conditioned to be applied to the blower increases. When the pressure loss applied to the blower is increased, an operating point of the forward fan is shifted from A to A, and an operating point of the backward fan is shifted from B to B'. The difference in air volume between the operating point of the forward fan and the operating point of the backward fan increases, which shows that the backward fan is more advantageous than the forward fan.

When the properties described above are used, the temperature conditioning unit can be further downsized.

In the above description, the temperature conditioning unit is a temperature conditioning device for a secondary battery to be used in a vehicle. The vehicle in this case may be a hybrid vehicle or an electric vehicle. In the temperature conditioning unit in the first exemplary embodiment, the object to be temperature-conditioned may be a power conversion device. Particularly, the power conversion device serving as the object to be temperature-conditioned includes a power conversion device to be used in a vehicle. Other examples of the power conversion device to be temperature-conditioned include an engine control unit, an inverter device, and an electric motor.

Second object to be temperature-conditioned 911 may be a circuit board, an electronic component, a radiator, a relay, or a semiconductor element.

Figure 8A:
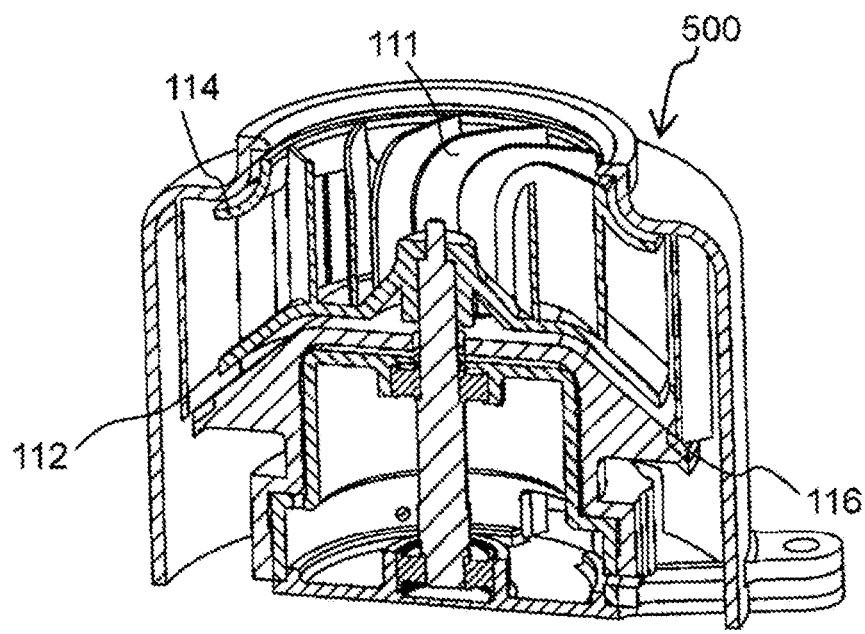
FIG. 8A is a perspective sectional view illustrating a configuration where the blower (centrifugal blower) illustrated in FIG. 1C is provided with a diffuser.
Figure 8B:
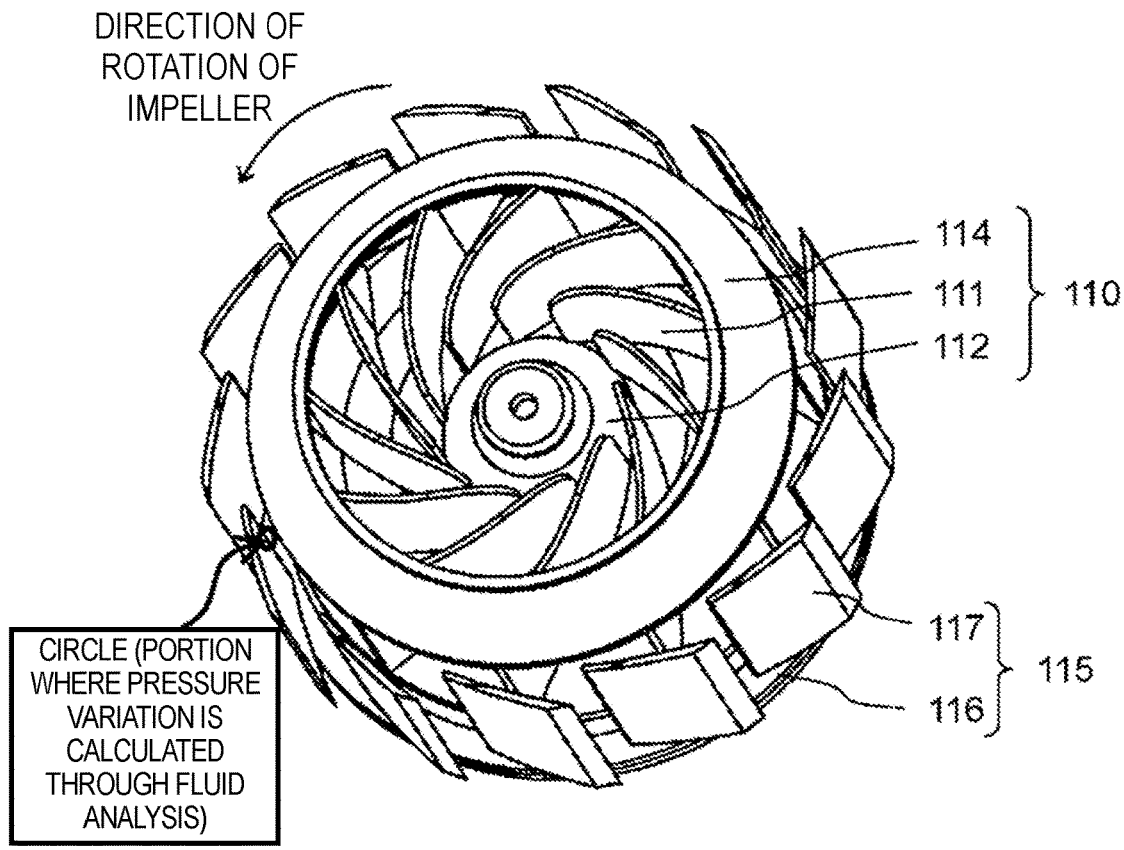
FIG. 8B is a front perspective view of the diffuser and the impeller of the blower (centrifugal blower) illustrated in FIG. 8A.
Figure 8C:
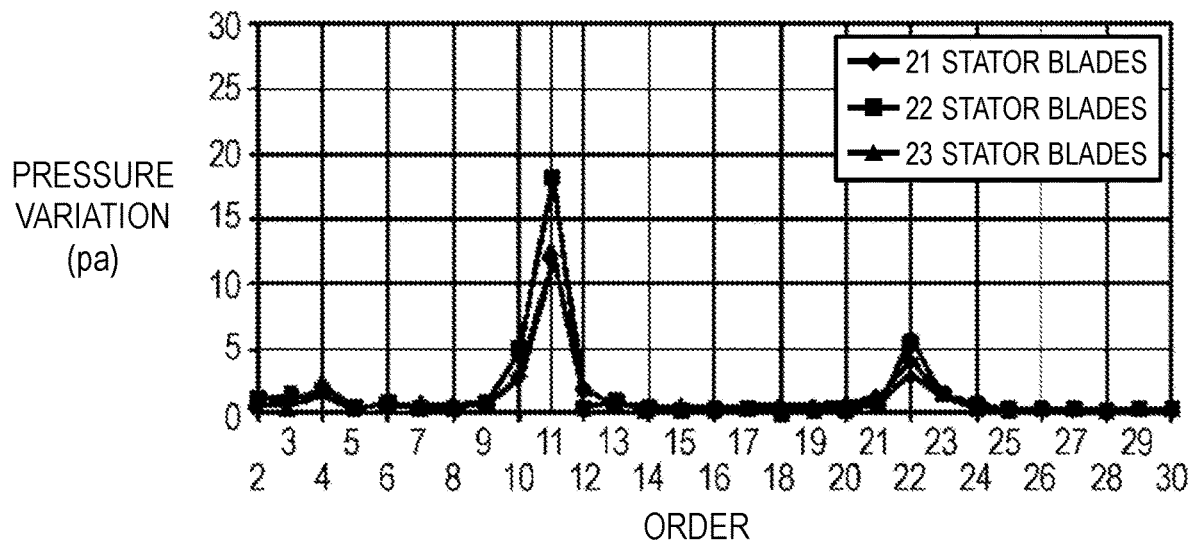
FIG. 8C is a characteristic diagram illustrating a result of measurement of a pressure variation of the diffuser used in the temperature conditioning unit according to the first exemplary embodiment.

FIG. 8A is a perspective sectional view illustrating a configuration where blower (centrifugal blower) 500 which is used in the temperature conditioning unit according to the first exemplary embodiment includes impeller 110 and diffuser 115. FIG. 8B is a perspective sectional view illustrating the configuration including impeller 110 and diffuser 115. FIG. 8C is a characteristic diagram illustrating a result of measurement of a pressure variation of the diffuser used in the temperature conditioning unit according to the first exemplary embodiment.

It should be noted that the configurations same as those of the temperature conditioning unit according to the present exemplary embodiment are designated by the same reference marks, and the descriptions of the configurations of the temperature conditioning unit described above are applied herein.

As illustrated in FIGS. 8A to 8C, the temperature conditioning unit according to the first exemplary embodiment can use the impeller and the diffuser described below.

Specifically, impeller 510 further has a plurality of stator blades 117. The plurality of stator blades 117 protrudes forward from the outer periphery of the impeller disk in the direction of rotation of impeller 510.

Impeller 510 is also provided with diffuser 115 on the outer periphery of impeller 510. Diffuser 115 has diffuser plate 116 and the plurality of stator blades 117. Diffuser plate 116 is provided parallel to the impeller disk. The plurality of stator blades 117 extends in the direction along rotary shaft 112a on a surface of diffuser plate 116, which faces the air intake hole. The plurality of stator blades 117 protrudes forward from the outer periphery of the impeller disk in the direction of rotation of impeller 510.

Specific configurations that can provide significant advantages and effects are as described below.

A number of the plurality of rotor blades 111 is defined as Zf. A number of the plurality of stator blades 117 is defined as Zd. A factor of number Zf is defined as F. A natural number is defined as n.

Under such a condition, the temperature conditioning unit satisfies $Zd \neq n \times F$.

In another mode, a natural number is defined as m and n. A number of poles of the electric motor is defined as P. A number of slots of the electric motor is defined as S. The least common multiple of number P of poles and number S of slots is defined as C. The factor of least common multiple C is defined as D.

Under such a condition, the temperature conditioning unit satisfies $m \times Zf \neq n \times P$, $m \times Zf \neq n \times S$, and $Zf \neq n \times D$.

A temperature conditioning unit according to still another mode satisfies $m \times Zf \neq n \times P$, $m \times Zf \neq n \times S$, $Zf \neq n \times D$, and $Zd \neq n \times F$.

Diffuser 115 includes either metal or resin as a material constituting diffuser 115.

A more detailed description will be given with reference to the drawings.

In the temperature conditioning unit according to the present exemplary embodiment, the centrifugal blower may have diffuser 115.

The diffuser is provided between the impeller and the electric motor serving as a rotary drive source. As illustrated in FIG. 8A, diffuser 115 has diffuser plate 116 and a plurality of stator blades 117. Diffuser plate 116 is positioned on a plane extending in a direction intersecting shaft 210 of the electric motor. Diffuser plate 116 has a substantially disk shape or a substantially torus shape. The plurality of stator blades 117 is provided on the surface of diffuser plate 116, which faces the air intake hole. The plurality of stator blades 117 regulates a centrifugal airflow which is a flow of air discharged from impeller 110.

Diffuser 115 provides the following operations and effects. Diffuser 115 reduces the flow velocity of the centrifugal airflow discharged from impeller 510 between the plurality of stator blades 117. Diffuser 115 also raises the pressure of the centrifugal airflow discharged from impeller 510. Therefore, the pressure of the centrifugal airflow discharged from the centrifugal blower provided with diffuser 115 is increased.

FIG. 8A illustrates the configuration where diffuser 115 described above is provided on the outer periphery of impeller 510 of blower (centrifugal blower) 500. FIG. 8B illustrates a state where diffuser 115 described above is provided on the outer periphery of impeller 510 of blower (centrifugal blower) 500. FIG. 8A illustrates the configuration where fan case 120, diffuser 115, and diffuser plate 116 are integrated as one example. Fan case 120, diffuser 115, and diffuser plate 116 may be an individual component.

When the centrifugal airflow discharged from impeller 510 is regulated using the plurality of stator blades 117 of diffuser 115, noise is generated. Such noise is caused due to a turbulent flow generated between the plurality of rotor blades 111 of impeller 510 and the plurality of stator blades 117 of diffuser 115. Such noise is also called blade passing frequency noise (BPF noise), rotor blade passing frequency noise, or discrete frequency noise. Such noise is referred to as BPF noise in the following description.

In order to reduce the noise, the centrifugal blower in the temperature conditioning unit according to the first exemplary embodiment employs a configuration example described below.

Configuration Example 1

The number of the plurality of rotor blades 111 of impeller 510 is defined as Zf. The number of the plurality of stator blades 117 of diffuser 115 is defined as Zd. The factor of number Zf of the plurality of rotor blades 111 of impeller 510 is defined as F. A natural number is defined as n.

The temperature conditioning unit according to the first exemplary embodiment has a configuration satisfying $Zd \neq n \times F$.

With this configuration, an occurrence of the BPF noise can be prevented.

If the rotation speed of impeller 510 is defined as N [r/min], frequency Fn of the BPF noise is $Fn = N/60 \times Zf$.

Configuration Example 2

The number of the plurality of rotor blades 111 of impeller 510 is defined as Zf. The number of the plurality of stator blades 117 of diffuser 115 is defined as Zd. A natural number is defined as m and n. The number of poles of the electric motor is defined as P. The number of slots of the electric motor is defined as S. The least common multiple of number P of the poles of the electric motor and number S of the slots of the electric motor is defined as C. Least common multiple C represents an order of cogging torque of the electric motor. The factor of least common multiple C is defined as D.

Under such a condition, the temperature conditioning unit according to the first exemplary embodiment has a configuration satisfying $m \times Zf \neq n \times P$, $m \times Zf \neq n \times S$, and $Zf \neq n \times D$.

With this configuration, an occurrence of the BPF noise can be prevented.

When the rotation speed of the impeller is defined as N [r/min], frequency Fc of noise caused by the cogging torque of the electric motor is $Fc = N/60 \times C$ [Hz].

The noise caused by the cogging torque of the electric motor can be expressed as vibration caused by the cogging torque of the electric motor.

Configuration Example 3

Configuration example 3 is a configuration satisfying configuration example 1 and configuration example 2 described above. That is, the temperature conditioning unit according to the first exemplary embodiment satisfies $m \times Zf \neq n \times P$, $m \times Zf \neq n \times S$, $Zf \neq n \times D$, and $Zd \neq n \times F$.

Diffuser

Now, the result of inspection of the diffuser included in the blower in the first exemplary embodiment will be described.

Number P of poles of the electric motor is commonly a multiple of 2. If a three-phase electric motor is used, number S of slots of the electric motor is a multiple of 3. Therefore, number Zf of the plurality of rotor blades of the impeller is preferably a prime.

The reason for this is as follows. When number Zf of the rotor blades of the impeller is equal to a multiple of or a factor of number P of the poles of the electric motor, or equal to a multiple of or a factor of number S of the slots of the electric motor, both the impeller and the electric motor generate excitation force that interact each other. Therefore, vibrations are mutually excited by the electric motor and the impeller, resulting in an increase in noise.

During manufacture of the electric motor, components constituting the electric motor may be distorted for any reason. In such a case, if the factor of order C of the cogging torque is defined as D, a vibration having a frequency D times as high as the rotation speed of the electric motor may occur.

To address such a problem, the following configurations are provided. A factor of least common multiple C of number P of the poles of the electric motor and number S of the slots of the electric motor is defined as D. In this case, the temperature conditioning unit is configured such that the number of the rotor blades of the impeller is not equal to factor D. With this configuration, the temperature conditioning unit can prevent an increase in vibration and/or noise.

The temperature conditioning unit to be used in a vehicle usually uses an impeller having an output of tens of watts. Therefore, in the temperature conditioning unit to be used in a vehicle, the number of the plurality of rotor blades of the impeller usually ranges from seven to fifteen. This is due to balance between the effect of regulating the airflow between blades with use of the diffuser and a friction loss caused on surfaces of the stator blades constituting the diffuser.

Now, specific examples will be described. The specification of the specific example is as follows. Number P of the poles of the electric motor is ten. Number S of the slots of the electric motor is twelve. The number of the plurality of rotor blades of the impeller is eleven. In this example, several diffusers having different numbers of a plurality of stator blades are prepared, and they are compared. Diffusers having twenty-one stator blades, twenty-two stator blades, and twenty-three stator blades are prepared.

They are compared in such a way that a pressure variation at the front edge of one of the stator blades of each diffuser is calculated through fluid analysis. The front edge where the pressure variation is calculated is marked with a circle in FIG. 8B. FIG. 8C shows a result of fast Fourier transform (FFT) analysis on pressure variations.

As illustrated in FIG. 8C, the largest pressure variation is obtained when the diffuser has twenty-two stator blades. The number twenty-two is an integral multiple of the number of rotor blades of the impeller.

FIG. 8C also shows that the diffuser having twenty-one stator blades provides a more satisfactory result than the diffuser having twenty-three stator blades. The pressure variations shown herein are causes of the BPF noise.

When the number of rotor blades of the impeller is eleven, the eleventh order of the rotation frequency caused by the rotation of the impeller is a fundamental harmonic. In other words, the fundamental harmonic is the eleventh order of the rotation frequency caused by the rotation of the impeller and is eleven times as high as the rotation frequency, wherein the number eleven is the number of the rotor blades of the impeller. The fundamental harmonic is represented by Nz. That is, the twenty-second order of the rotation frequency caused by the rotation of the impeller is expressed as 2Nz which means the second-order harmonic.

Nz can be calculated from the following equation.

$$Nz = \text{rotation frequency } N(Hz) \times \text{number } z \text{ of rotor blades of the impeller}$$

In this equation, the unit (Hz) indicating rotation frequency N can be also expressed as "rps" (revolutions per second) indicating the rotation speed per second. Number z of the rotor blades of the impeller is a dimensionless number having no unit.

The result of the FFT analysis described above shows a remarkable difference in amplitude of the pressure variations between Nz which is the eleventh order of the rotation frequency and 2Nz which is the twenty-second order of the rotation frequency.

In the temperature conditioning unit according to the first exemplary embodiment, the order of the cogging torque can be increased by increasing number P of poles of the electric motor. Unfortunately, when the order of the cogging torque is increased by increasing number P of poles of the electric motor, a proportion of a leakage magnetic flux between poles with respect to a main magnetic flux of the electric motor increases. Therefore, an amount of an effective magnetic flux that can be used by the electric motor is decreased, which leads to deterioration in efficiency of the electric motor.

Accordingly, in the above specific example, an electric motor having ten poles and twelve slots is selected so as to increase the least common multiple with the number of rotor blades of the impeller, in consideration of improvement in efficiency of the electric motor and an increase in the order of the cogging torque.

Impeller disk 112 in the present exemplary embodiment may have guide part 113 inclined toward outlet hole 916 on the outer periphery of impeller disk 112.

Further, in each of the plurality of rotor blades 111, inner-periphery-side end 111a may be positioned forward of outer-periphery-side end 111b in the direction of rotation of impeller 110.

In addition, impeller 110 may further have a plurality of stator blades 117 protruding forward from the outer periphery of impeller disk 112 in the direction of rotation of impeller 110.

Impeller 110 may also be provided with diffuser 115 having: diffuser plate 116 which is positioned parallel to impeller disk 112; and a plurality of stator blades 117 which extends in the direction along rotary shaft 112a on a surface of diffuser plate 116, which faces air intake hole 915. The plurality of stator blades 117 may protrude forward from the outer periphery of impeller disk 112 in the direction of rotation of impeller 110.

Second Exemplary Embodiment

Figure 9A:
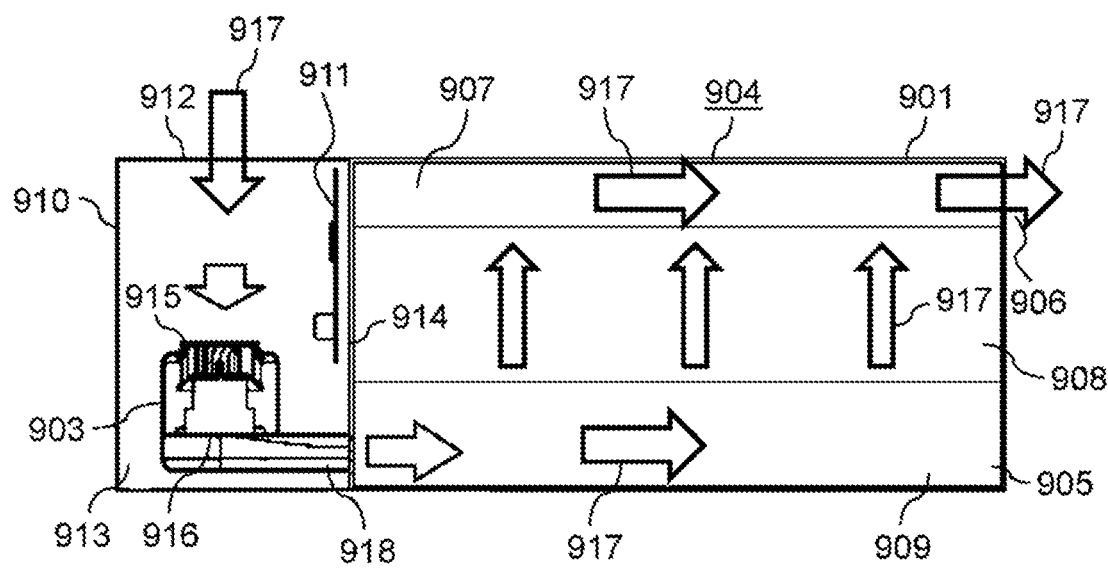
FIG. 9A is a schematic view illustrating a temperature conditioning unit according to a second exemplary embodiment.
Figure 9B:
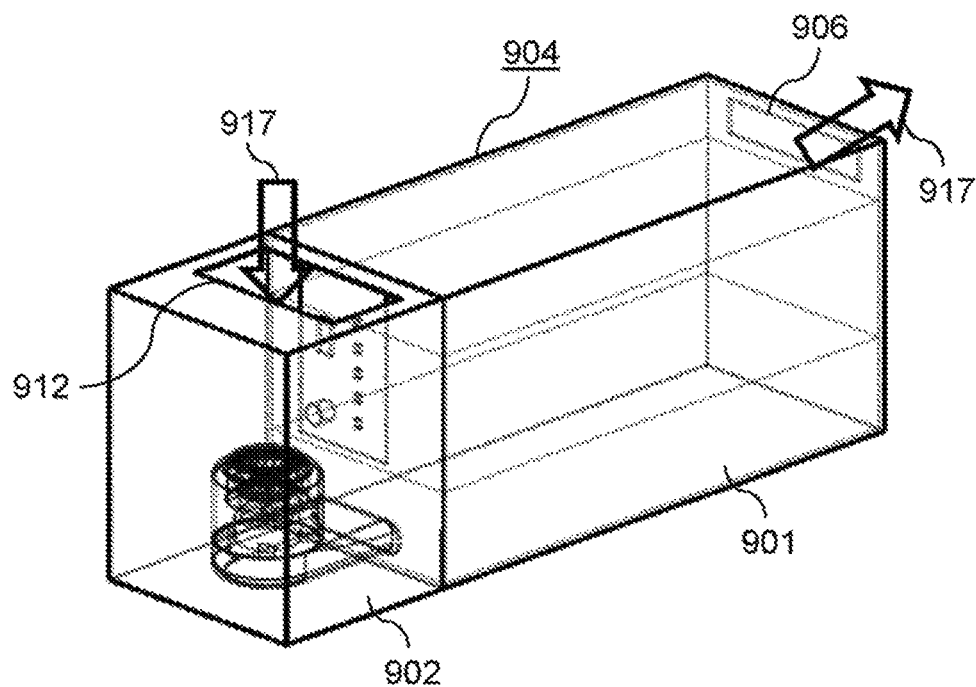
FIG. 9B is a perspective view illustrating the temperature conditioning unit according to the second exemplary embodiment.

FIG. 9A is a schematic view illustrating temperature conditioning unit 904 according to a second exemplary embodiment. FIG. 9B is a perspective view illustrating temperature conditioning unit 904 according to the second exemplary embodiment. As illustrated in FIGS. 9A and 9B, temperature conditioning unit 904 is provided with impeller 110, electric motor 200, fan case 120, first housing 905, second housing 910, first temperature conditioning unit part 901, and second temperature conditioning unit part 902.

In FIG. 9A, airflow is indicated by arrow 917. Airflow 917 schematically indicates air flowing through temperature conditioning unit 904. A secondary battery serving as an object to be temperature-conditioned is housed in first housing 905. A circuit board, an electronic component, a radiator, a relay, or a semiconductor element serving as an object to be temperature-conditioned is housed in second housing 910.

As illustrated in FIG. 9A, first housing 905 is provided adjacent to second housing 910. Blower (centrifugal blower) 903 is provided in a flow path that communicates first housing 905 with second housing 910. First air hole part 906 discharges air discharged from blower (centrifugal blower) 903 to the outside of temperature conditioning unit 904. Second air hole part 912 suctions air to be supplied to blower (centrifugal blower) 903 from the outside of temperature conditioning unit 904.

As illustrated in FIGS. 1C and 1D, blower (centrifugal blower) 903 has impeller 110 and fan case 120. Impeller 110 has impeller disk 112 having a substantially disk shape. A plurality of rotor blades 111 is formed on impeller disk 112. Fan case 120 has side wall 1121 and air intake hole 915. Side wall 1121 is a substantially cylindrical side surface extending in the direction of axis 112b of rotary shaft 112a included in impeller 110. Air intake hole 915 is positioned in the direction of axis 112b. Air intake hole 915 is circularly opened around axis 112b in a surface intersecting the direction of axis 112b. Impeller 110 is connected to the electric motor serving as a rotary drive source via shaft 210.

As illustrated in FIGS. 9A and 9B, an outlet hole of blower (centrifugal blower) 903 and the first air hole part of first housing 905 are connected to each other via air path 918. When the electric motor serving as a rotary drive source rotates, impeller 110 rotates through shaft 210. When impeller 110 rotates, air flows in through air intake hole 915 formed in fan case 120. Air flowing in through air intake hole 915 is given energy from rotary blades 111. The air having been given energy from rotary blades 111 is discharged in a direction substantially perpendicular to rotary shaft 112a along impeller disk 112. The air discharged from impeller 110 changes its direction and flows toward outlet hole 1123 along an inner wall surface of fan case 120.

The inner wall surface of fan case 120 preferably has a gently curved surface so as not to interfere with airflow 917. The air flowing through air intake hole 915 of fan case 120 flows into the second housing, and cools second object to be temperature-conditioned 911 placed in third air chamber 913 of second temperature conditioning unit part 902. This air is suctioned through a third air hole part. The outlet hole of the blower is connected to first air chamber 907 of the first housing. When the blower discharges air, the pressure in first air chamber 907 increases. Thus, the secondary battery serving as the first object to be temperature-conditioned is cooled or heated by air flowing from first chamber 907. Then, the air flows through third air chamber 913, and is discharged through second air hole part 912. Second air hole part 912 is one or a plurality of openings formed in any portion of second housing 910 as appropriate.

A dust-proof air filter may be provided to first air hole part 906 and second air hole part 912. A dehumidification device may be attached to first air hole part 906 and second air hole part 912.

Third Exemplary Embodiment

Figure 10A:
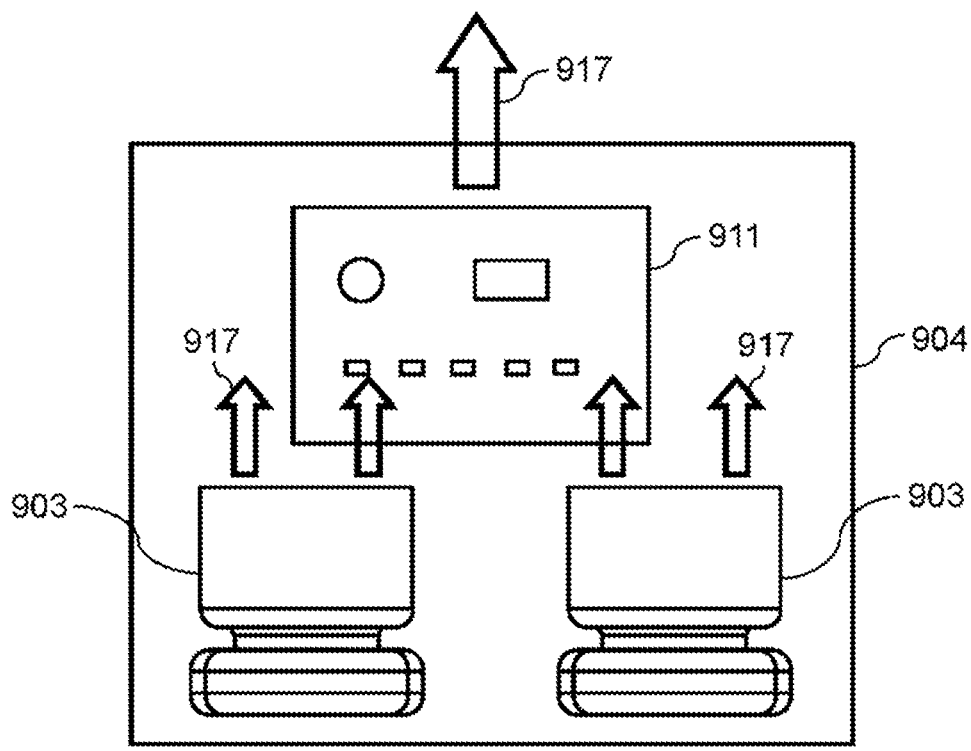
FIG. 10A is a schematic view illustrating a temperature conditioning unit according to a third exemplary embodiment.
Figure 10B:
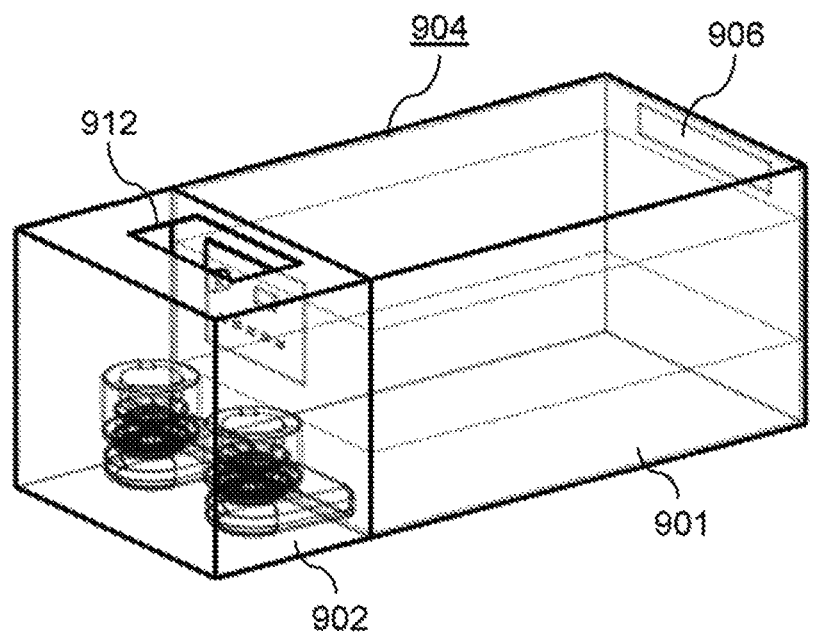
FIG. 10B is a perspective view illustrating the temperature conditioning unit according to the third exemplary embodiment.

FIG. 10A is a schematic view illustrating temperature conditioning unit 904 according to a third exemplary embodiment. FIG. 10B is a perspective view illustrating temperature conditioning unit 904 according to the third exemplary embodiment.

In the third exemplary embodiment, air is suctioned through a first air hole part, and flows from a first air chamber to a second air chamber. Thus, a first object to be temperature-conditioned is cooled or heated. The air in the first air chamber is suctioned by the blower and the air discharged from the blower is discharged to a third air chamber. Thus, the air cools the second object to be temperature-conditioned, and then, is discharged through the second air hole part. In the fourth exemplary embodiment, a plurality of blowers is provided. This configuration can provide a sufficient temperature conditioning effect, even when the object to be temperature-conditioned has a large capacity and needs a high air volume.

Fourth Exemplary Embodiment

Figure 10C:
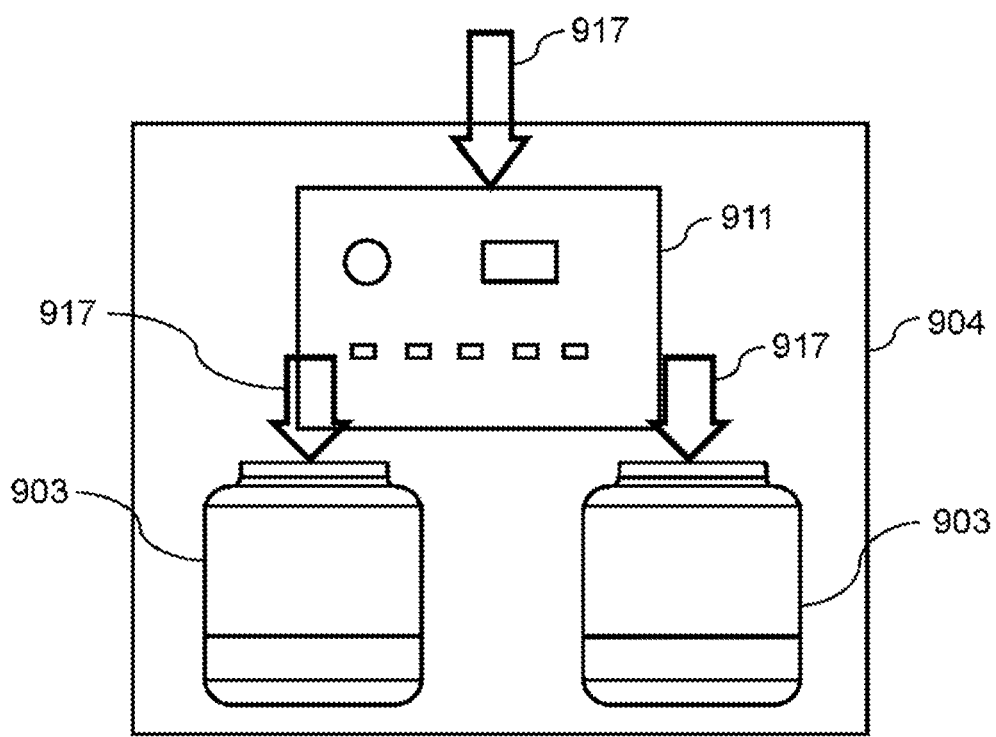
FIG. 10C is a schematic view illustrating a temperature conditioning unit according to another mode of a fourth exemplary embodiment.
Figure 10D:
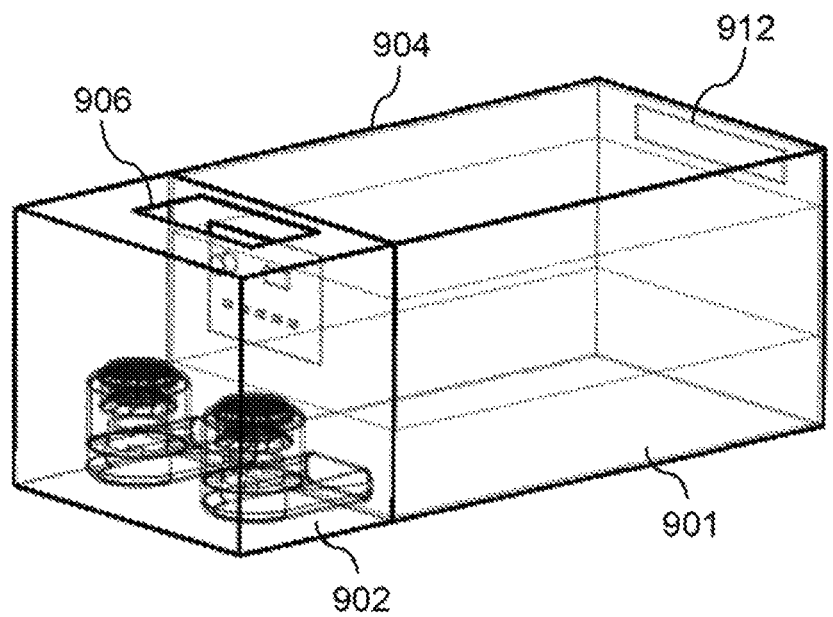
FIG. 10D is a perspective view illustrating the temperature conditioning unit according to the other mode of the fourth exemplary embodiment.

FIG. 10C is a schematic view illustrating temperature conditioning unit 904 according to a fourth exemplary embodiment. FIG. 10D is a perspective view illustrating temperature conditioning unit 904 according to the fourth exemplary embodiment.

In the fourth exemplary embodiment, air is suctioned through a second air hole part, and flows from a third air chamber to a second air chamber. A second object to be temperature-conditioned is cooled or heated by airflow generated in the third air chamber. The air in the third air chamber is suctioned by the blower and the air discharged from the blower is discharged to the second air chamber. The air in the second air chamber is then sent to the first air chamber. Thus, the air cools the first object to be temperature-conditioned, and then, is discharged through the first air hole part. In the fourth exemplary embodiment, a plurality of blowers is provided. This configuration can provide a sufficient temperature conditioning effect, even when the object to be temperature-conditioned has a large capacity and needs a high air volume.

Fifth Exemplary Embodiment

Figure 11A:
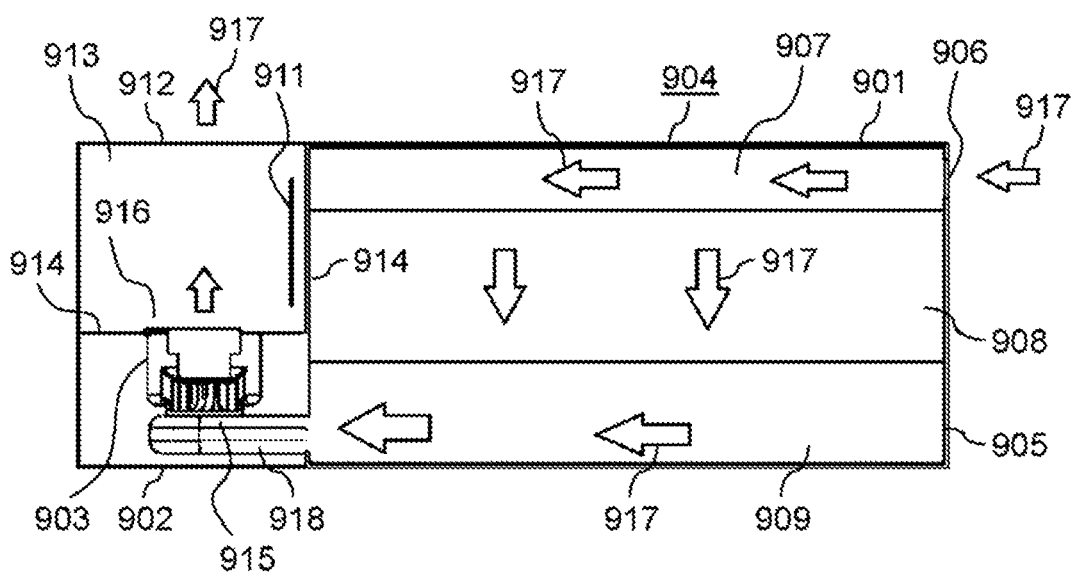
FIG. 11A is a schematic view illustrating a temperature conditioning unit according to a fifth exemplary embodiment.
Figure 11B:
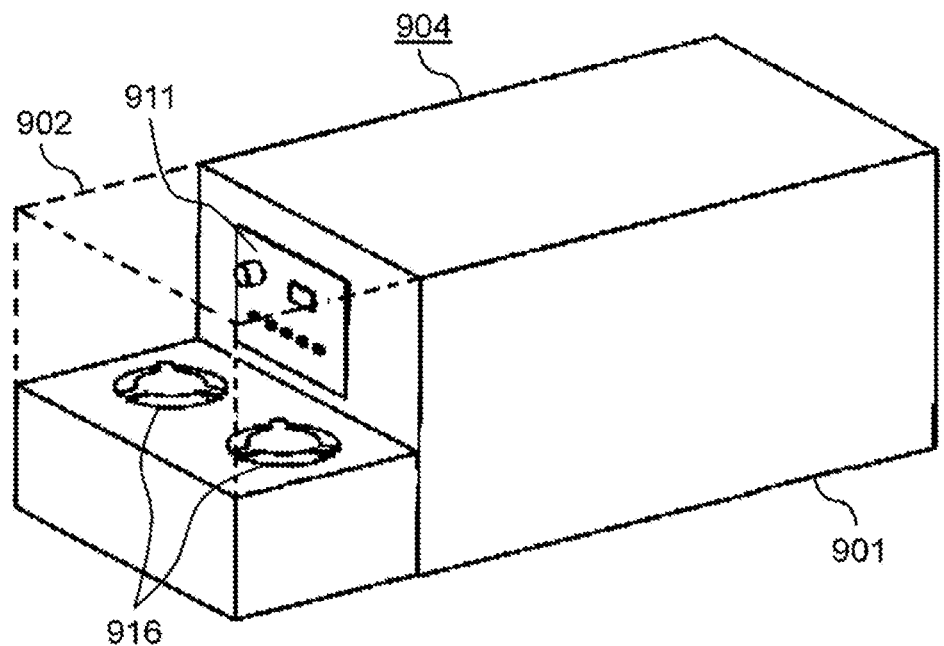
FIG. 11B is a perspective view illustrating the temperature conditioning unit according to the fifth exemplary embodiment.

FIG. 11A is a schematic view illustrating a temperature conditioning unit according to a fifth exemplary embodiment. FIG. 11B is a perspective view illustrating the temperature conditioning unit according to the fifth exemplary embodiment. The fifth exemplary embodiment has a configuration similar to the configuration of the third exemplary embodiment.

In the fifth exemplary embodiment, air is suctioned through first air hole part 906 into first air chamber 907. Air that cools twelfth object to be temperature-conditioned 908 is suctioned by blower (centrifugal blower) 903. Due to the air suction by the blower, the air flows into second air chamber 909 from first air chamber 907. Thus, the air cools or heats the first object to be temperature-conditioned, and then, is discharged through the second air hole part. Airflow is schematically indicated by arrow 917.

FIG. 11B is a perspective view illustrating the temperature conditioning unit from which the second housing is removed. In FIG. 11A, if the temperature conditioning unit is configured such that first air chamber 907 is connected to blower (centrifugal blower) 903 via air path 918, fixation of components and a countermeasure against leakage of air from joint portions are complicated. In the temperature conditioning unit illustrated in FIGS. 11A and 11B, the first housing, the fan case of blower (centrifugal blower) 903, and air path 918 are integrated. Thus, the first housing and blower (centrifugal blower) 903 can be easily mounted. In addition, the rigidity of the temperature conditioning unit is improved, whereby the strength is increased. Accordingly, the temperature conditioning unit which is resistant to external impact can be provided.

Temperature conditioning unit 904 in the present exemplary embodiment includes first temperature conditioning unit part 901, second temperature conditioning unit part 902, and blower (centrifugal blower) 903. First temperature conditioning unit part 901 includes first housing 905, first air hole part 906, first air chamber 907, first object to be temperature-conditioned 908, and second air chamber 909. Second temperature conditioning unit part 902 includes second housing 910, second object to be temperature-conditioned 911, second air hole part 912, and third air chamber 913. Temperature conditioning unit 904 includes partition wall 914 formed such that a part of a wall of first housing 905 serves as a part of a wall of second housing 910 or partition wall 914 formed such that a part of the wall of second housing 910 serves as a part of the wall of first housing 905. Temperature conditioning unit 904 has air path 918 for connecting air intake hole 915 of blower (centrifugal blower) 903 and second air chamber 909 so as to allow passage of air, a structure for disposing outlet hole 916 of blower (centrifugal blower) 903 and third air chamber 913 so as to allow passage of air, a structure for disposing at least a part of second object to be temperature-conditioned 911 inside third air chamber 913, and a structure for disposing at least a part of blower (centrifugal blower) 903 inside third air chamber 913.

Blower (centrifugal blower) 903 includes: impeller disk 112 that has rotary shaft 112*a* at a central portion and a surface extending in a direction intersecting rotary shaft 112*a*; impeller 110 having a plurality of rotor blades 111, each of which extends in a direction along rotary shaft 112*a*, has a circular-arc cross section in a direction intersecting rotary shaft 112*a*, and has inner-periphery-side end 111*a* positioned closer to rotary shaft 112*a* and outer-periphery-side end 111*b* positioned on an opposite side from rotary shaft 112*a*, the circular-arc cross-section protruding in a direction of rotation of impeller disk 112; an electric motor that includes shaft 210 and that transmits a rotary motion to rotary shaft 112*a* through shaft 210; fan case 120 (see FIGS. 1C and 1D) that has a side wall extending in a longitudinal direction of rotary shaft 112*a* so as to cover impeller 110 and air intake hole 915 positioned in the longitudinal direction of rotary shaft 112*a*; and outlet hole 123 (see FIGS. 1C and 1D) corresponding to air intake hole 915. Fan case 120 has flow path 118*a* (see FIG. 1D) for guiding, toward outlet hole 123 (see FIG. 1D) along side wall 121 (see FIG. 1D), air that is suctioned through air intake hole 915 and flows toward outer-periphery-side end 111*b* (see FIG. 1D) from inner-periphery-side end 111*a* (see FIG. 1D) due to rotation of impeller 110 by a rotary motion transmitted from electric motor 200 (see FIG. 1D).

Thus, the present exemplary embodiment can provide the temperature conditioning unit that can provide preferable cooling and heating even when the pressure resistance of entire temperature conditioning unit 904 increases due to an increase in density of objects housed in temperature conditioning unit 904.

Temperature conditioning unit 904 may have a plurality of blowers (centrifugal blowers) 903.

Sixth Exemplary Embodiment

Figure 12A:
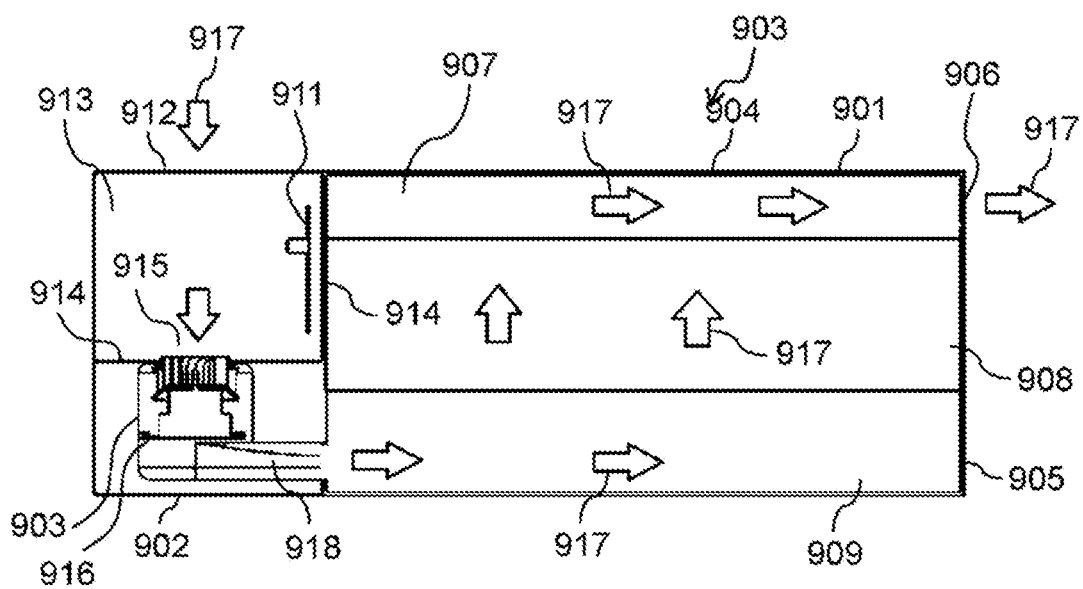
FIG. 12A is a schematic view illustrating a temperature conditioning unit according to a sixth exemplary embodiment.
Figure 12B:
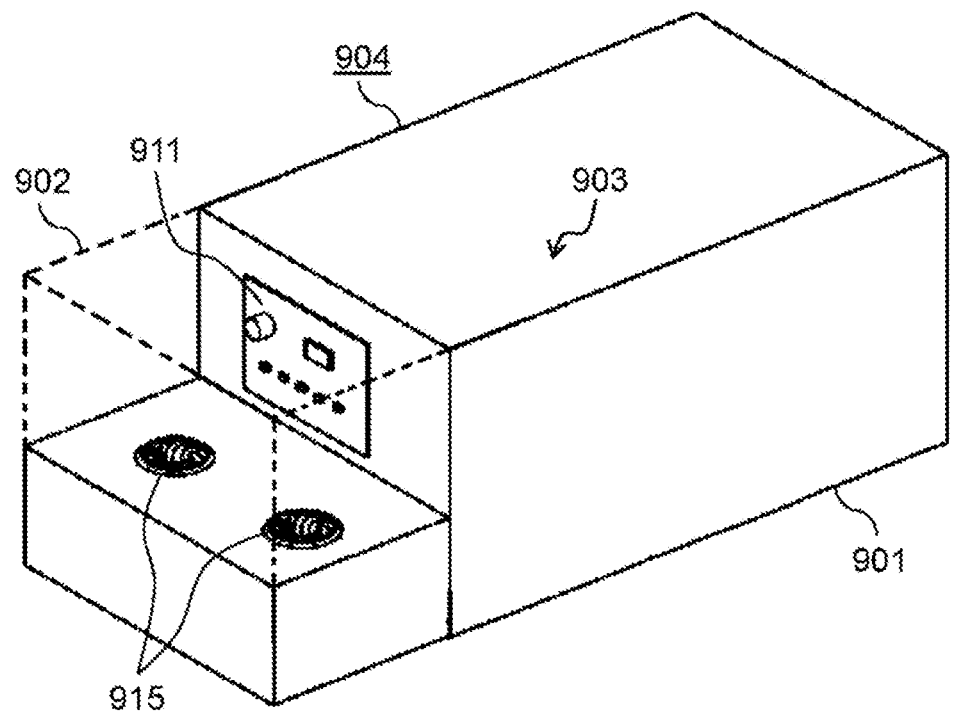
FIG. 12B is a perspective view illustrating the temperature conditioning unit according to the sixth exemplary embodiment.

FIG. 12A is a schematic view illustrating a temperature conditioning unit according to a sixth exemplary embodiment. FIG. 12B is a perspective view illustrating the temperature conditioning unit according to the sixth exemplary embodiment. The sixth exemplary embodiment has a configuration similar to the configuration of the fourth exemplary embodiment.

In the sixth exemplary embodiment, air is suctioned through second air hole part 912 into third air chamber 913. Air that cools second object to be temperature-conditioned 911 is suctioned by blower 903. Due to air discharge by the blower, the air flows into second air chamber 907 from second air chamber 909. Thus, the air cools or heats the first object to be temperature-conditioned, and then, is discharged through the first air hole part. Airflow is schematically indicated by arrow 917.

FIG. 12B is a perspective view illustrating the temperature conditioning unit from which the second housing is removed. In FIG. 12A, if the temperature conditioning unit is configured such that first air chamber 907 is connected to blower (centrifugal blower) 903 via air path 918, fixation of components and a countermeasure against leakage of air from joint portions are complicated. In the temperature conditioning unit illustrated in FIGS. 12A and 12B, the first housing, the fan case of blower 903, and air path 918 are integrated. Thus, the first housing and blower (centrifugal blower) 903 can be easily mounted. In addition, the rigidity of the temperature conditioning unit is improved, whereby the strength is increased. Accordingly, the temperature conditioning unit which is resistant to external impact can be provided.

Temperature conditioning unit 904 in the present exemplary embodiment includes first temperature conditioning unit part 901, second temperature conditioning unit part 902, and blower (centrifugal blower) 903. First temperature conditioning unit part 901 includes first housing 905, first air hole part 906, first air chamber 907, first object to be temperature-conditioned 908, and second air chamber 909. Second temperature conditioning unit part 902 includes second housing 910, second object to be temperature-conditioned 911, second air hole part 912, and third air chamber 913. Temperature conditioning unit 904 includes partition wall 914 formed such that a part of a wall of first housing 905 serves as a part of a wall of second housing 910 or partition wall 914 formed such that a part of the wall of second housing 910 serves as a part of the wall of first housing 905. (The following may need to be checked or changed.) Temperature conditioning unit 904 has air path 918 for connecting outlet hole 916 of blower (centrifugal blower) 903 and second air chamber 909 so as to allow passage of air, a structure for disposing air intake hole 915 of blower (centrifugal blower) 903 and third air chamber 913 so as to allow passage of air, a structure for disposing at least a part of second object to be temperature-conditioned 911 inside third air chamber 913, and a structure for disposing at least a part of blower (centrifugal blower) 903 inside third air chamber 913.

Blower (centrifugal blower) 903 includes: impeller disk 112 that has rotary shaft 112*a* at a central portion and a surface extending in a direction intersecting rotary shaft 112*a*; impeller 110 having a plurality of rotor blades 111, each of which extends in a direction along rotary shaft 112*a*, has a circular-arc cross section in a direction intersecting rotary shaft 112*a*, and has inner-periphery-side end 111*a* positioned closer to rotary shaft 112*a* and outer-periphery-side end 111*b* positioned on an opposite side from rotary shaft 112*a*, the circular-arc cross-section protruding in a direction of rotation of impeller disk 112; an electric motor that includes shaft 210 and that transmits a rotary motion to rotary shaft 112*a* through shaft 210; fan case 120 (see FIGS. 1C and 1D) that has a side wall extending in a longitudinal direction of rotary shaft 112*a* so as to cover impeller 110 and air intake hole 915 positioned in the longitudinal direction of rotary shaft 112*a*; and outlet hole 123 (see FIGS. 1C and 1D) corresponding to air intake hole 915. Fan case 120 has flow path 118*a* (see FIG. 1D) for guiding, toward outlet hole 123 (see FIG. 1D) along side wall 121 (see FIG. 1D), air that is suctioned through air intake hole 915 and flows toward outer-periphery-side end 111b (see FIG. 1D) from inner-periphery-side end 111a (see FIG. 1D) due to rotation of impeller 110 by a rotary motion transmitted from electric motor 200 (see FIG. 1D).

Thus, the present exemplary embodiment can provide the temperature conditioning unit that can provide preferable cooling and heating even when the pressure resistance of entire temperature conditioning unit 904 increases due to an increase in density of objects housed in temperature conditioning unit 904.

Temperature conditioning unit 904 may have a plurality of blowers (centrifugal blowers) 903.

Sixth Exemplary Embodiment

In FIGS. 12A and 12B, air flows into third air chamber 913 through second air hole part 912, and is suctioned by blower (centrifugal blower) 903. The air discharged from blower (centrifugal blower) 903 flows toward second air chamber 909+ from first air chamber 907, and is discharged through second air hole part 912.

Temperature conditioning unit 904 in the present exemplary embodiment includes first temperature conditioning unit part 901, second temperature conditioning unit part 902, and blower (centrifugal blower) 903. First temperature conditioning unit part 901 includes first housing 905, first air hole part 906, first air chamber 907, first object to be temperature-conditioned 908, and second air chamber 909. Second temperature conditioning unit part 902 includes second housing 910, second object to be temperature-conditioned 911, second air hole part 912, and third air chamber 913. Temperature conditioning unit 904 includes partition wall 914 formed such that a part of a wall of first housing 905 serves as a part of a wall of second housing 910 or partition wall 914 formed such that a part of the wall of second housing 910 serves as a part of the wall of first housing 905. (The following may need to be checked or changed.) Temperature conditioning unit 904 has a structure for connecting outlet hole 916 of blower (centrifugal blower) 903 and second air chamber 909 so as to allow passage of air, a structure for disposing air intake hole 915 of blower (centrifugal blower) 903 and third air chamber 913 so as to allow passage of air, a structure for disposing at least a part of second object to be temperature-conditioned 911 inside third air chamber 913, and a structure for disposing at least a part of blower (centrifugal blower) 903 inside third air chamber 913.

Blower (centrifugal blower) 903 includes: impeller disk 112 that has rotary shaft 112a at a central portion and a surface extending in a direction intersecting rotary shaft 112a; impeller 110 having a plurality of rotor blades 111, each of which extends in a direction along rotary shaft 112a, has a circular-arc cross section in a direction intersecting rotary shaft 112a, and has inner-periphery-side end 111a positioned closer to rotary shaft 112a and outer-periphery-side end 111b positioned on an opposite side from rotary shaft 112a, the circular-arc cross-section protruding in a direction of rotation of impeller disk 112; an electric motor that includes shaft 210 and that transmits a rotary motion to rotary shaft 112a through shaft 210; fan case 120 (see FIGS. 1C and 1D) that has a side wall extending in a longitudinal direction of rotary shaft 112a so as to cover impeller 110 and air intake hole 915 positioned in the longitudinal direction of rotary shaft 112a; and outlet hole 123 (see FIGS. 1C and 1D) corresponding to air intake hole 915. Fan case 120 has flow path 118a (see FIG. 1D) for guiding, toward outlet hole 123 (see FIG. 1D) along side wall 121 (see FIG. 1D), air that is suctioned through air intake hole 915 and flows toward outer-periphery-side end 111b (see FIG. 1D) from inner-periphery-side end 111a (see FIG. 1D) due to rotation of impeller 110 by a rotary motion transmitted from electric motor 200 (see FIG. 1D).

Thus, the present exemplary embodiment can provide the temperature conditioning unit that can provide preferable cooling and heating even when the pressure resistance of entire temperature conditioning unit 904 increases due to an increase in density of objects housed in temperature conditioning unit 904.

Temperature conditioning unit 904 may have a plurality of blowers (centrifugal blowers) 903.

Seventh Exemplary Embodiment

Figure 13A:
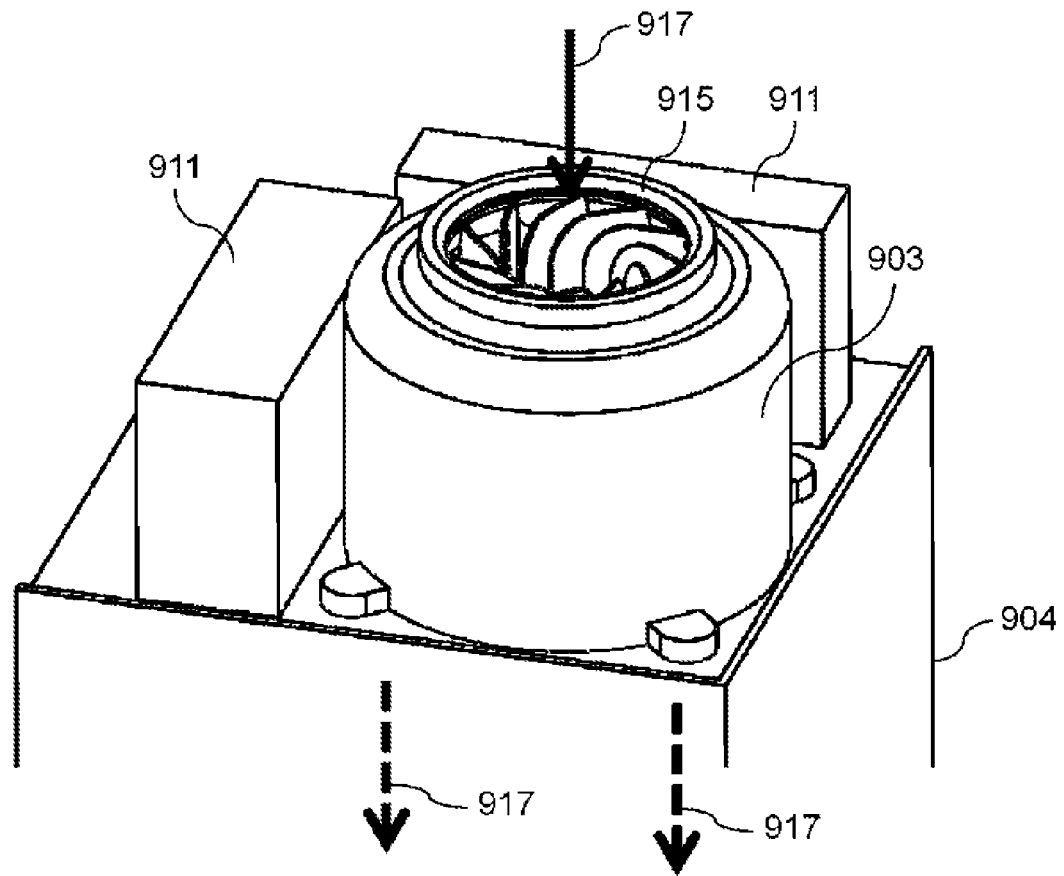
FIG. 13A is a perspective view illustrating arrangement of a blower according to a seventh exemplary embodiment.
Figure 13B:
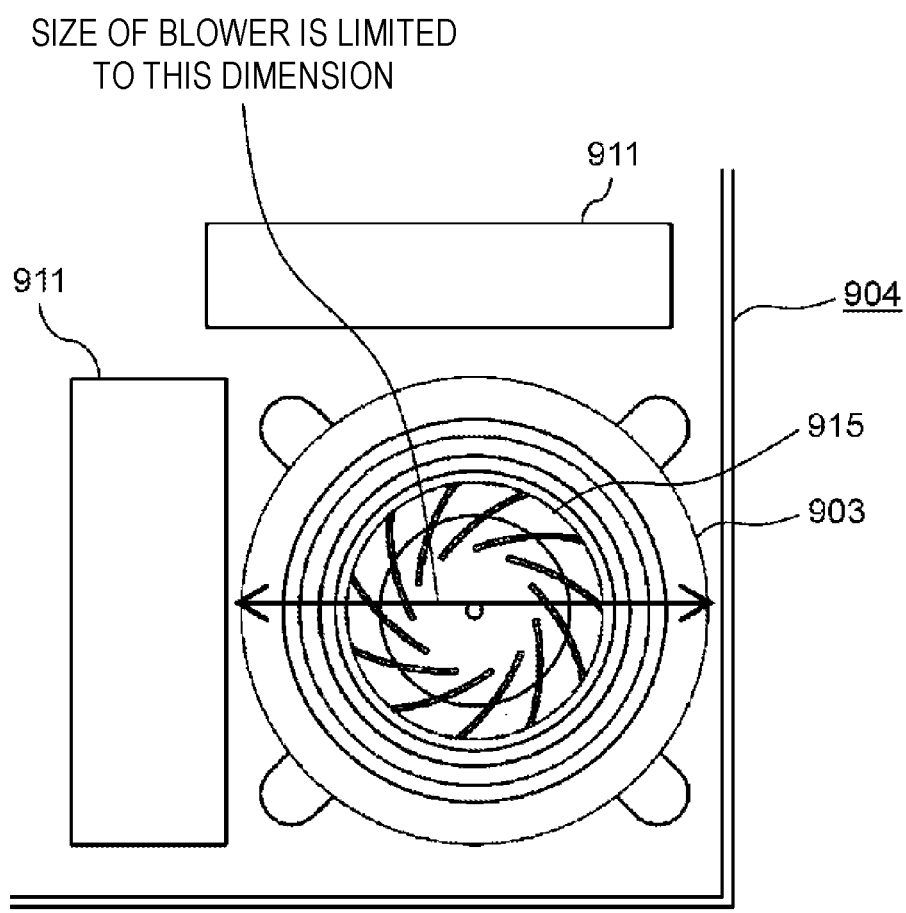
FIG. 13B is a top view illustrating the arrangement of the blower according to the seventh exemplary embodiment.

FIG. 13A is a perspective view illustrating disposition of blower (centrifugal blower) 903 in a seventh exemplary embodiment. FIG. 13B is a top view illustrating the disposition of blower (centrifugal blower) 903 in the seventh exemplary embodiment. A fan case of blower (centrifugal blower) 903 is symmetric with respect to a rotary shaft of a fan, that is, formed into a cylindrical shape. The flow of air discharged from the fan is symmetric with respect to the rotary shaft. Therefore, the distribution of the airflow is uniform in the circumferential direction, and a local change in the flow velocity and a change in the flow direction are prevented. Accordingly, the flow of air discharged from blower (centrifugal blower) 903 can also be made uniform in the circumferential direction. When, for example, a plurality of second objects to be temperature-conditioned 911 is disposed around blower (centrifugal blower) 903, the size (outer dimension) of blower (centrifugal blower) 903 is limited, so that it may be impossible to select a blower having a preferable size.

Eighth Exemplary Embodiment

Figure 14:
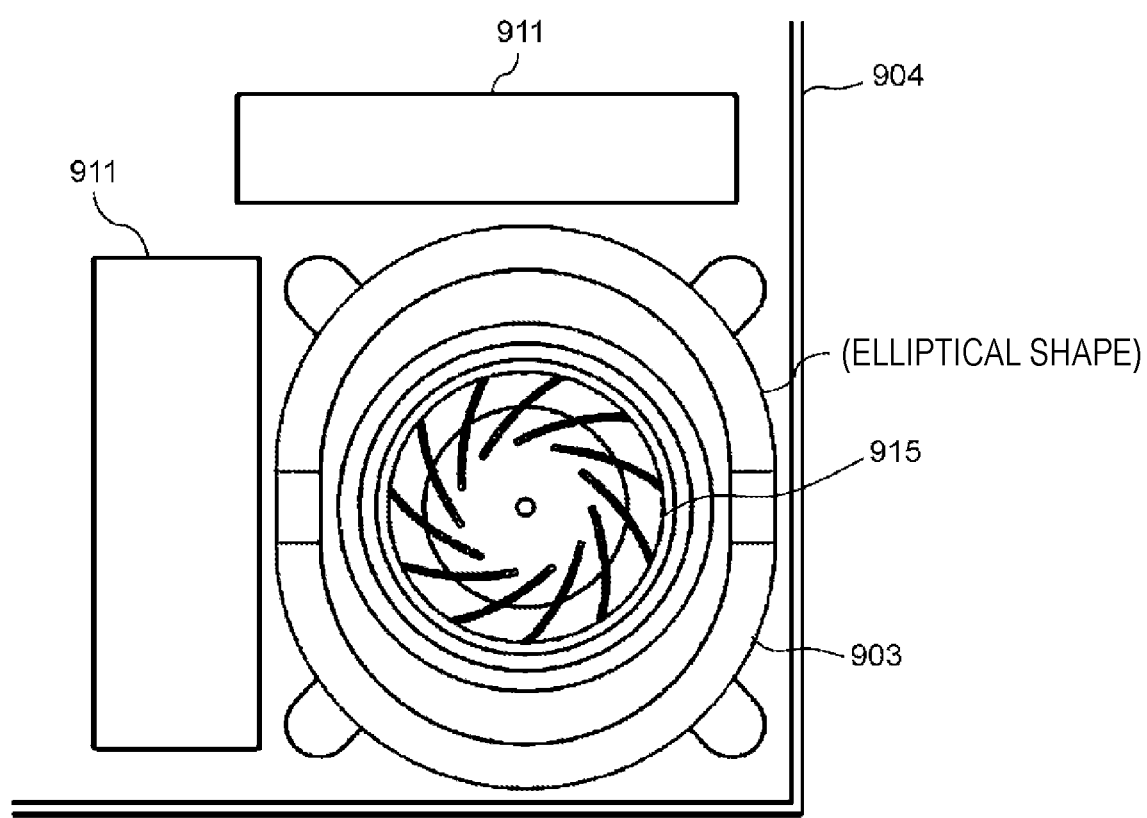
FIG. 14 is a top view illustrating a blower according to an eighth exemplary embodiment.
Figure 15:
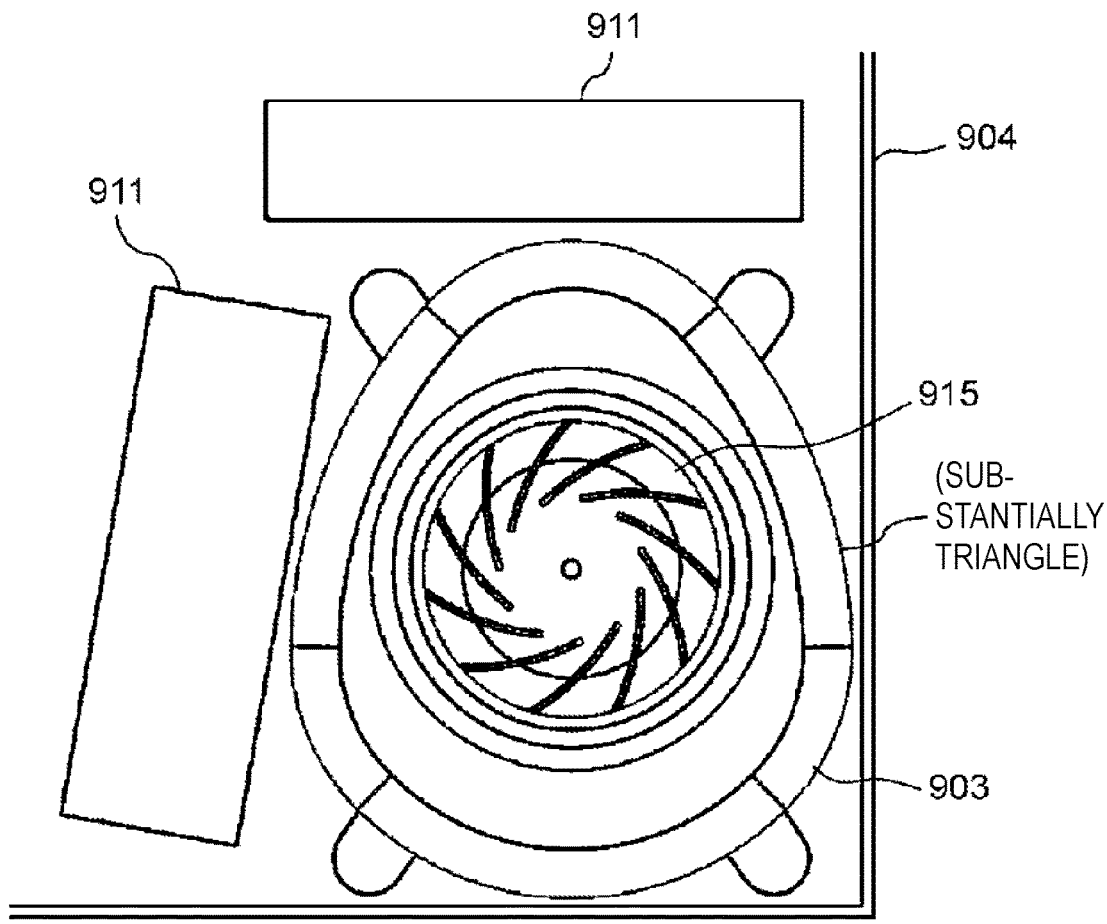
FIG. 15 is a top view illustrating another blower according to the eighth exemplary embodiment.

FIG. 14 is a top view illustrating blower (centrifugal blower) 903 in an eighth exemplary embodiment. FIG. 15 is a top view illustrating another blower (centrifugal blower) 903 in the eighth exemplary embodiment. A fan case of blower (centrifugal blower) 903 is not formed into a cylindrical shape symmetric with respect to a rotary shaft of a fan, but formed into an elliptical shape. If the fan case of blower (centrifugal blower) 903 is formed into a cylindrical shape when an area where blower (centrifugal blower) 903 is installed is narrow, a sufficient flow path area cannot be ensured, and blower 903 may not sufficiently exhibit its performance. In such a case, the fan case of blower (centrifugal blower) 903 is formed into an elliptical shape illustrated in FIG. 14 or a substantially polygonal shape (non-circular shape or substantially triangular shape) illustrated in FIG. 15. When the fan case is formed into a substantially triangular shape, a narrow space can be effectively used. Therefore, the flow path area of the blower can be increased. Accordingly, an output of the blower can be increased.

Figure 16:
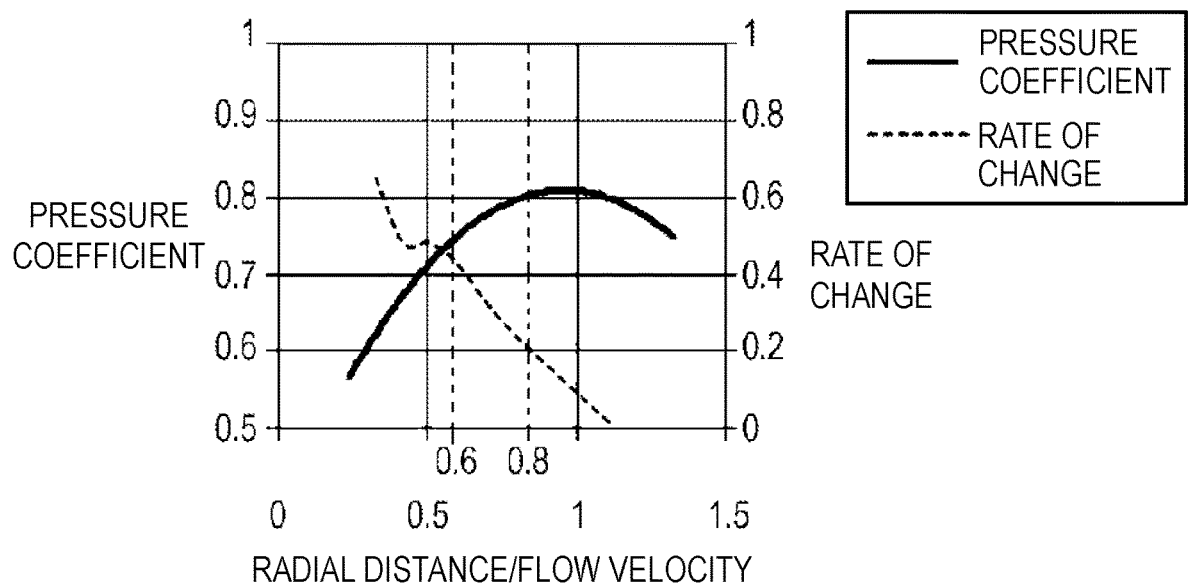
FIG. 16 is a graph in which a horizontal axis represents a ratio of an average radial distance of a fan case to a flow velocity at an outlet of the fan, and a vertical axis represents a pressure coefficient, in the eighth exemplary embodiment.

FIG. 16 is a graph in which a horizontal axis represents a ratio of an average radial distance of the fan case to the flow velocity at an outlet of the fan, and a vertical axis represents a pressure coefficient, in the eighth exemplary embodiment. The average radial distance of the fan case is a length obtained by averaging distances from the outlet of the fan to the fan case in the circumferential direction. As illustrated in FIG. 16, the pressure coefficient has a maximum value with respect to the ratio between the flow velocity at the outlet of the fan and the radial distance. Therefore, the output of the blower can be effectively increased by employing a fan case in which a ratio between a flow velocity at an outlet of a fan and the radial distance is within a range from 0.6 to 0.8. When the ratio between the flow velocity at the outlet of the fan and the radial distance is greater than about 0.8, pressure recovery is not achieved, and no remarkable effect is obtained. A preferable range of the ratio between the flow velocity at the outlet of the fan and the radial distance is within a range about from 0.6 to 0.8.

Ninth Exemplary Embodiment

Figure 17A:
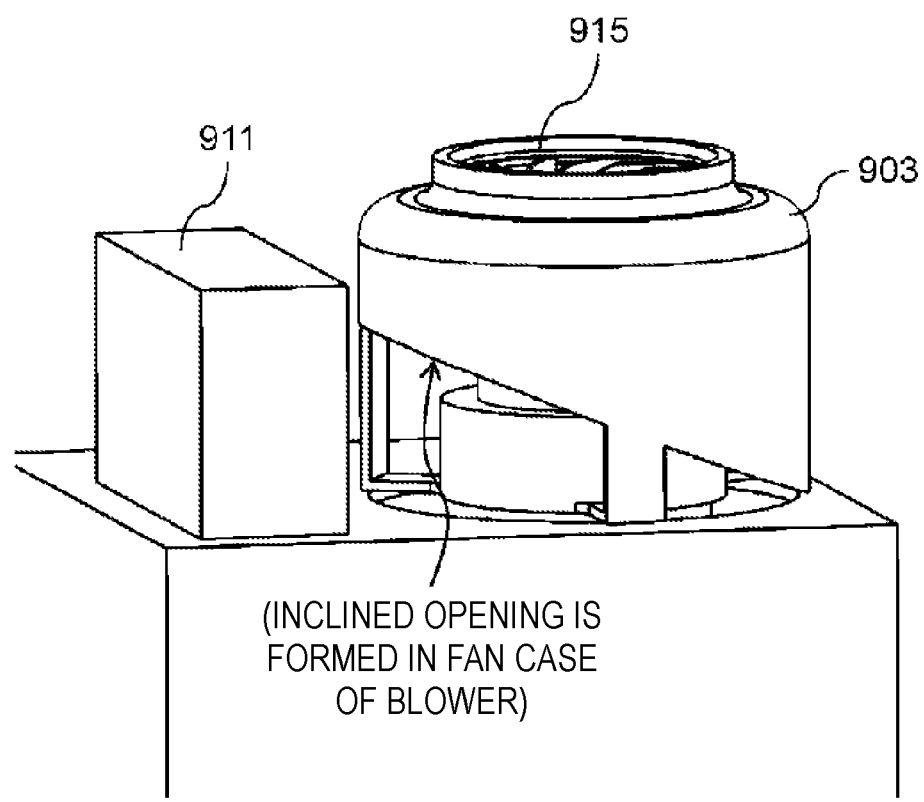
FIG. 17A is a perspective view illustrating a blower according to a ninth exemplary embodiment.
Figure 17B:
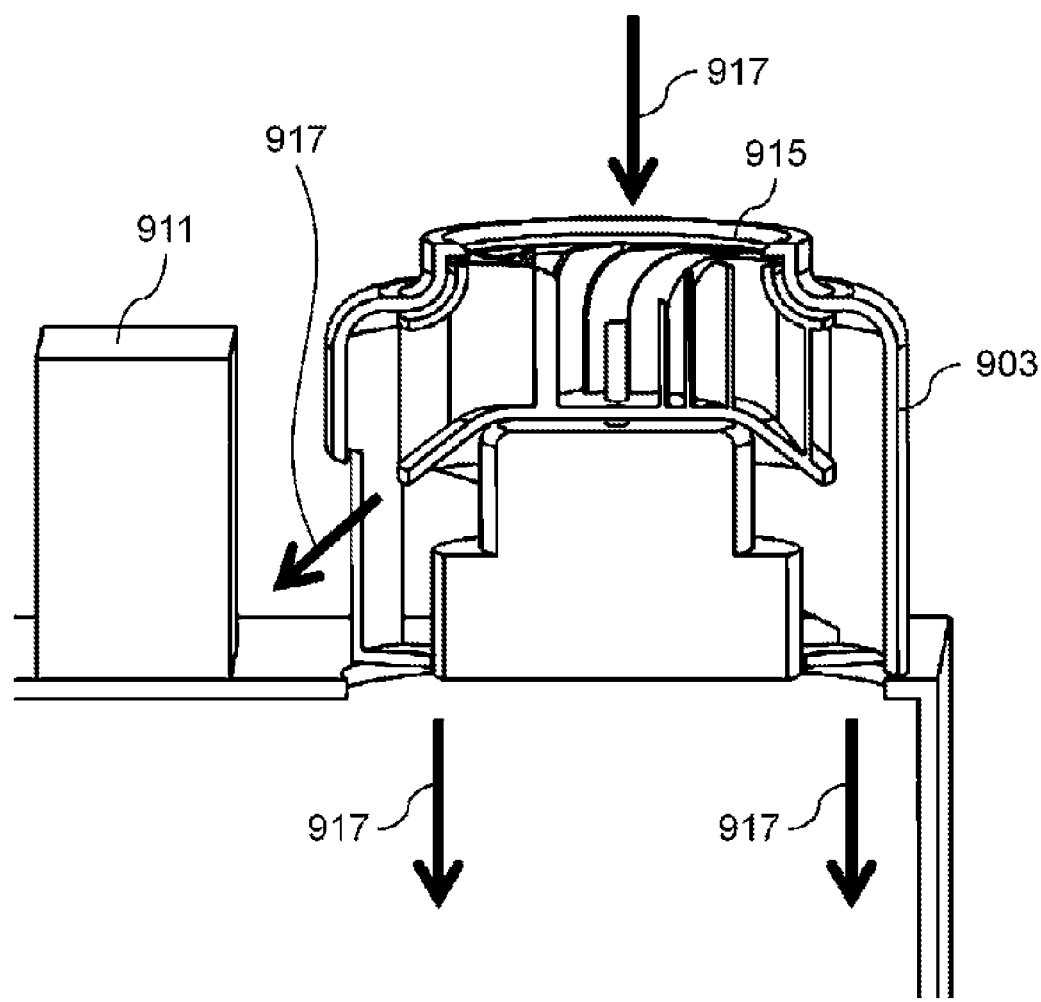
FIG. 17B is a side view illustrating the blower according to the ninth exemplary embodiment.
Figure 18:
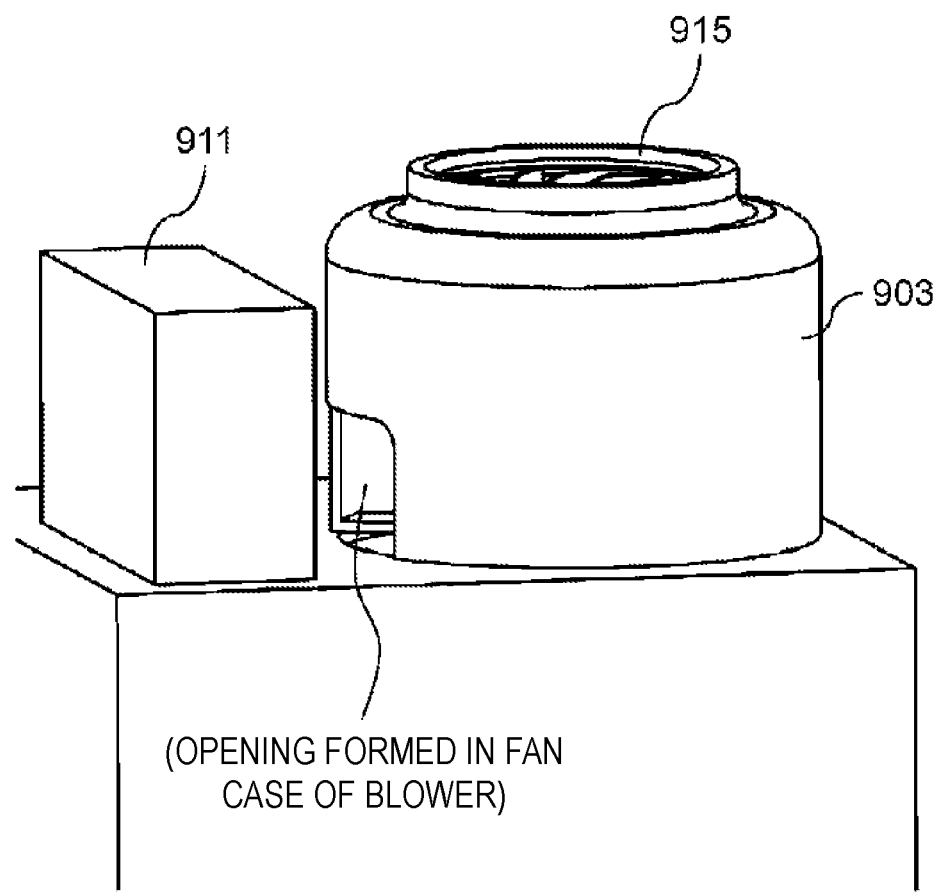
FIG. 18 is a perspective view illustrating a blower according to another mode of the ninth exemplary embodiment.

FIG. 17A is a perspective view illustrating blower (centrifugal blower) 903 in the eighth exemplary embodiment. FIG. 17B is a side view illustrating blower (centrifugal blower) 903 in the eighth exemplary embodiment. FIG. 18 is a perspective view illustrating blower (centrifugal blower) 903 in another mode of the eighth exemplary embodiment. The fan case of blower (centrifugal blower) 903 illustrated in FIGS. 17A and 17B is configured such that the edge line of the fan case is not on a plane perpendicular to a rotary shaft of a fan, and a portion in proximity to second object to be temperature-conditioned 911 is short in a height direction. With this configuration, a radial component of a flow of air discharged from blower (centrifugal blower) 903 is increased at the portion of the fan case which is short in the height direction, whereby air can be blown to second object to be temperature-conditioned 911. Accordingly, an effect of cooling second object to be temperature-conditioned 911 can be improved. As a shape in which the fan case is decreased in height at any position, a shape formed by cutting the fan case along a plane angled with respect to the rotary shaft of the fan is illustrated in FIGS. 17A and 17B. However, such a shape may be a partial cutout. The shape is not unique.

A fan case of blower (centrifugal blower) 903 illustrated in FIG. 18 has an outlet hole in a part of a side wall in proximity to second object to be temperature-conditioned 911. With this configuration, a portion of air flowing into the fan can be discharged through the outlet hole and sent to second object to be temperature-conditioned 911. Accordingly, an effect of cooling second object to be temperature-conditioned 911 can be improved. The shape of the outlet hole formed in the side wall of blower (centrifugal blower) 903 may be circular, elliptical, polygonal, or the like.

Tenth Exemplary Embodiment

Figure 19:
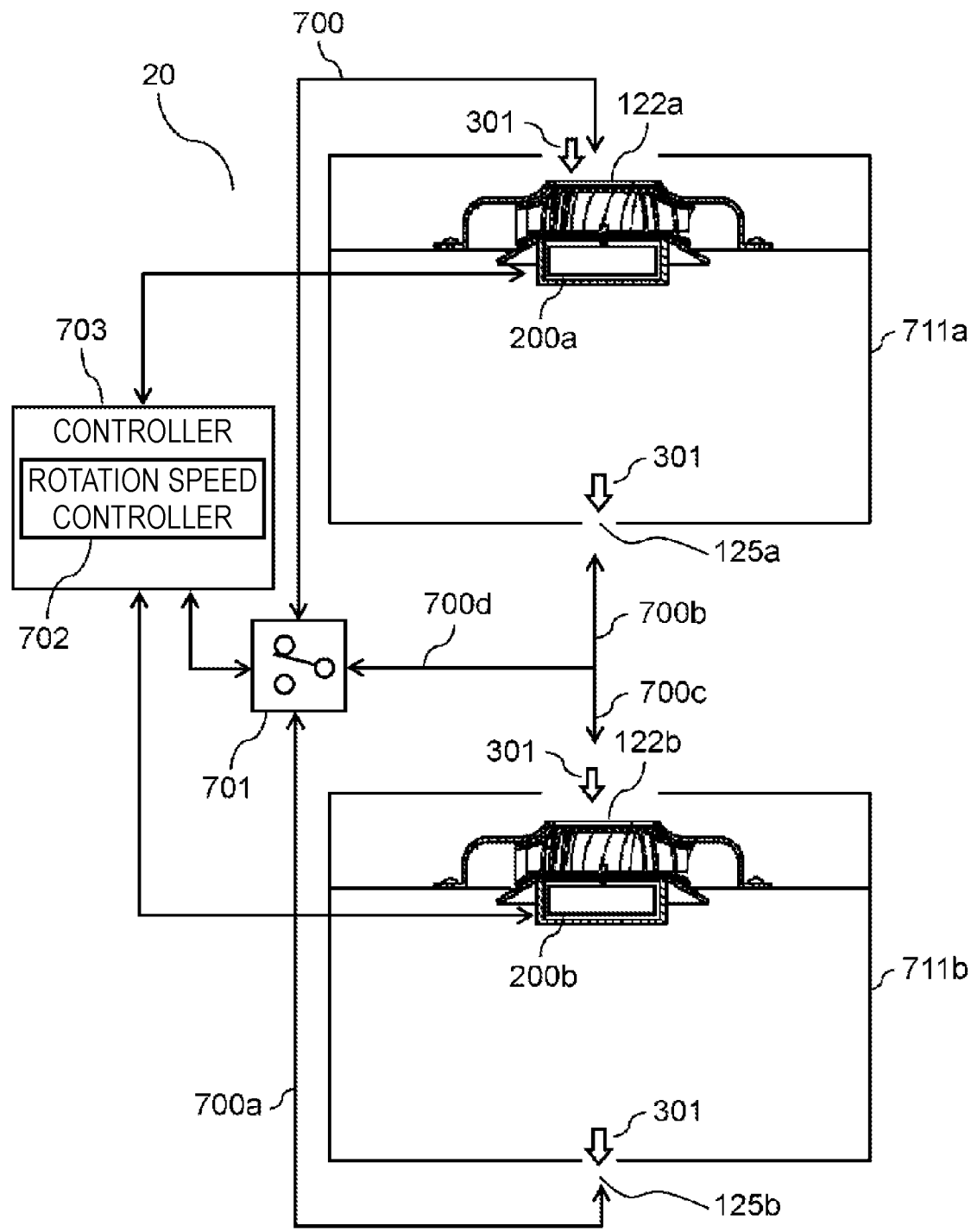
FIG. 19 is a diagram schematically illustrating a temperature conditioning system according to a tenth exemplary embodiment.
Figure 20:
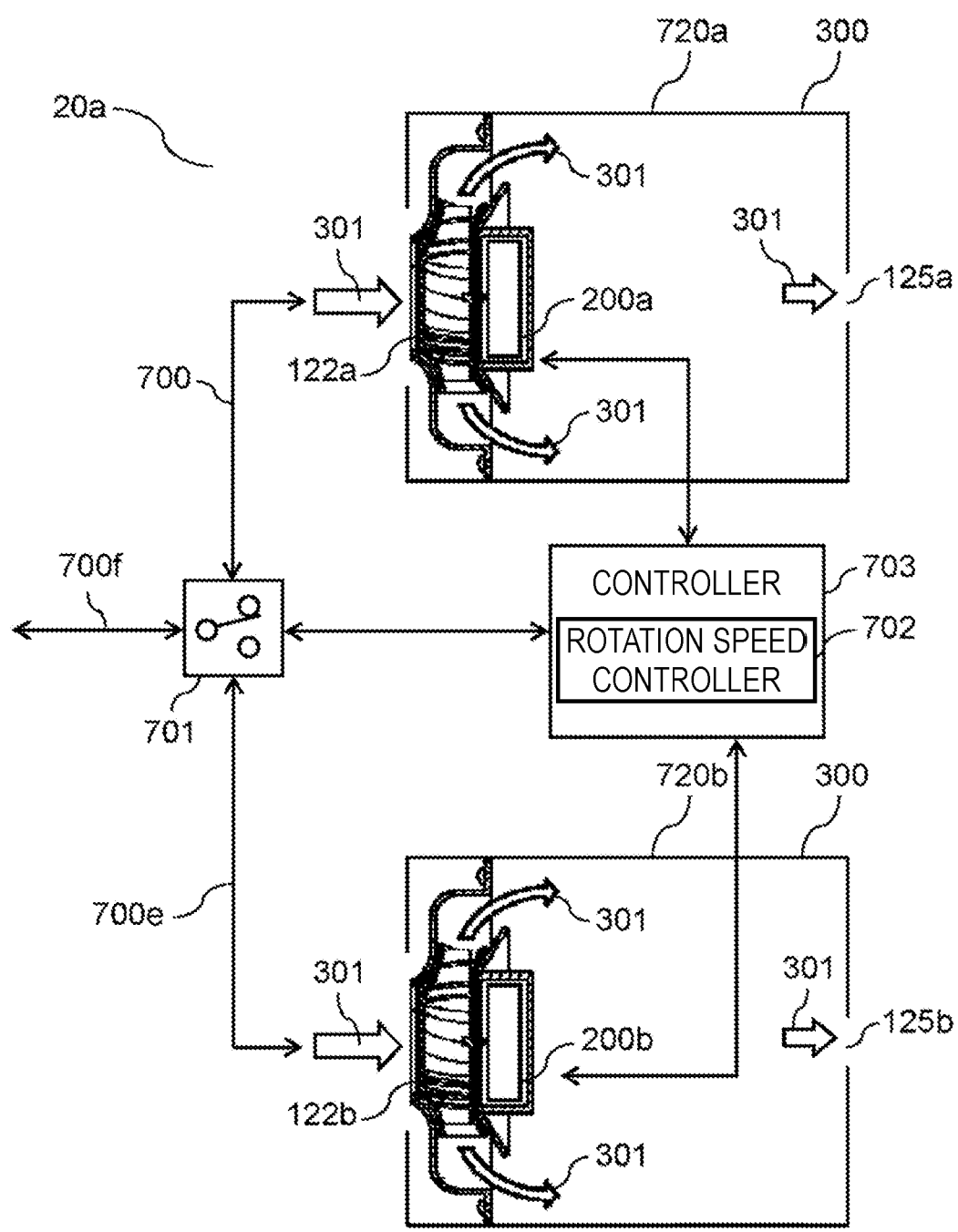
FIG. 20 is a diagram schematically illustrating another temperature conditioning system according to the tenth exemplary embodiment.
Figure 21:
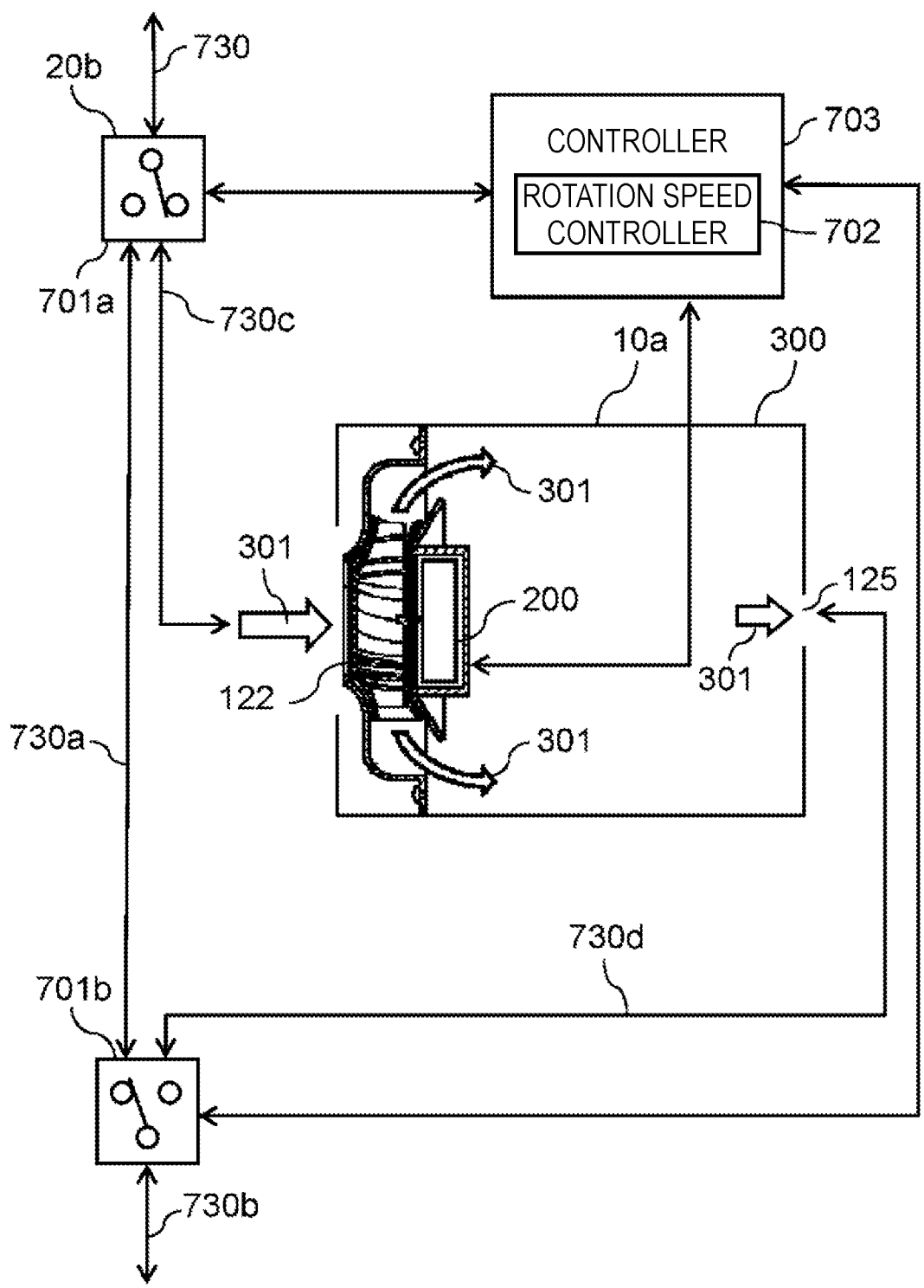
FIG. 21 is a diagram schematically illustrating still another temperature conditioning system according to the tenth exemplary embodiment.

FIG. 19 is a diagram schematically illustrating temperature conditioning system 20 according to a tenth exemplary embodiment. FIG. 20 is a diagram schematically illustrating another temperature conditioning system 20a according to the tenth exemplary embodiment. FIG. 21 is a diagram schematically illustrating still another temperature conditioning system 20b according to the tenth exemplary embodiment.

Figure 22:
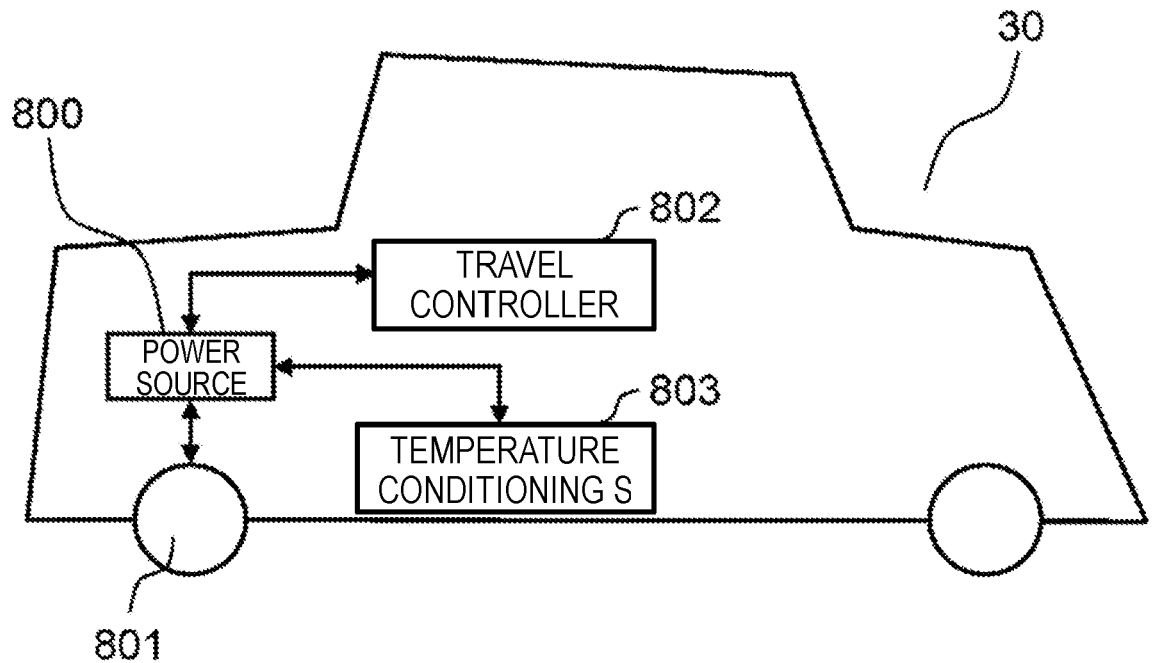
FIG. 22 is a schematic view schematically illustrating a vehicle according to the tenth exemplary embodiment.
Figure 23:
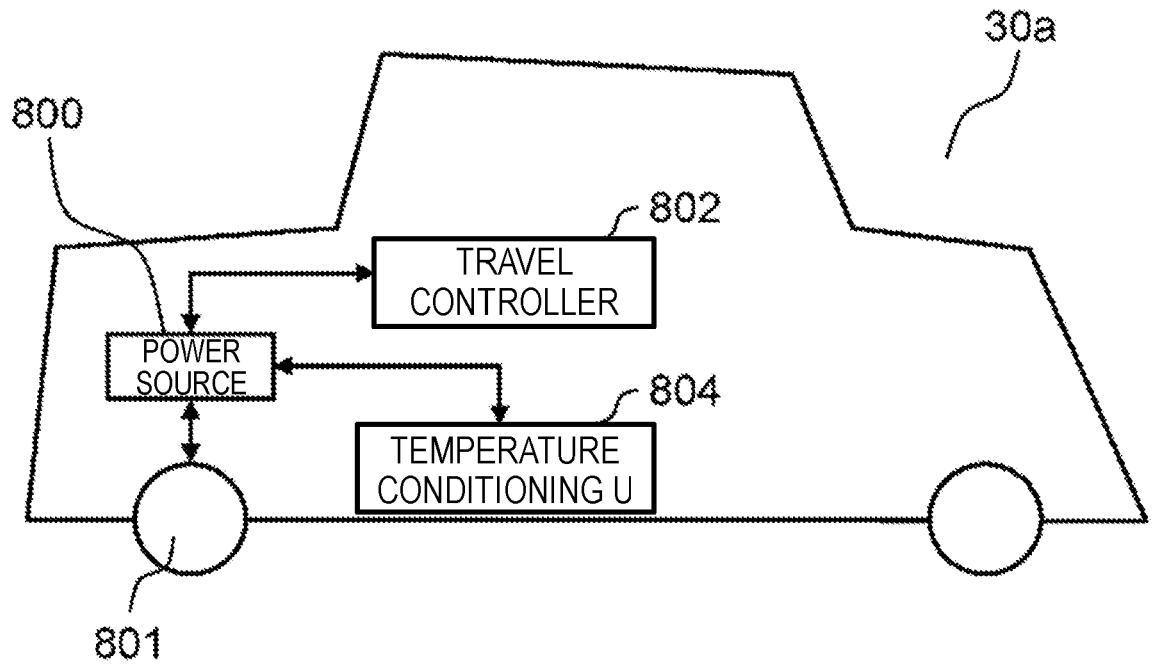
FIG. 23 is a schematic view schematically illustrating another vehicle according to the tenth exemplary embodiment.

FIG. 22 is a schematic view schematically illustrating vehicle 30 according to the tenth exemplary embodiment. FIG. 23 is a schematic view schematically illustrating another vehicle 30a according to the tenth exemplary embodiment.

It should be noted that, in the present exemplary embodiment, configurations same as those of the temperature conditioning units described above are designated by the same reference marks, and the descriptions of the configurations in the temperature conditioning units described above are applied herein.

As illustrated in FIGS. 19 to 21, the temperature conditioning system according to the present exemplary embodiment is configured as follows.

As illustrated in FIG. 19, temperature conditioning system 20 according to the present exemplary embodiment includes first temperature conditioning unit 711a, second temperature conditioning unit 711b, a plurality of ducts 700, 700a, 700b, 700c, and 700d, switching unit 701, rotation speed controller 702, and controller 703. A white arrow schematically indicates airflow 301.

Any of the temperature conditioning units described in the above exemplary embodiments can be used for first temperature conditioning unit 711a and second temperature conditioning unit 711b. FIG. 19 schematically illustrates the temperature conditioning units described in the present exemplary embodiment.

Ducts 700b and 700c, which are included in the plurality of ducts, connect discharge hole 125a of first temperature conditioning unit 711a to air intake hole 122b of second temperature conditioning unit 711b.

Ducts 700 and 700a, which are included in the plurality of ducts, connect air intake hole 122a of first temperature conditioning unit 711a to discharge hole 125b of second temperature conditioning unit 711b.

Switching unit 701 switches connection states of ducts 700, 700a, and 700d.

Rotation speed controller 702 controls either a rotation speed of electric motor 200a included in first temperature conditioning unit 711a or a rotation speed of electric motor 200b included in second temperature conditioning unit 711b.

Controller 703 controls switching unit 701 and rotation speed controller 702. Controller 703 controls flow paths or volumes of air flowing through the plurality of ducts 700, 700a, 700b, 700c, and 700d.

As illustrated in FIG. 20, temperature conditioning system 20a according to the present exemplary embodiment includes first temperature conditioning unit 720a, second temperature conditioning unit 720b, a plurality of ducts 700, 700e, and 700f, switching unit 701, rotation speed controller 702, and controller 703.

Any of the temperature conditioning units described in the above exemplary embodiments can be used for first temperature conditioning unit 720a and second temperature conditioning unit 720b.

Ducts 700 and 700e, which are included in the plurality of ducts, connect air intake hole 122a of first temperature conditioning unit 720a to air intake hole 122b of second temperature conditioning unit 720b.

The plurality of ducts may connect discharge hole 125a of first temperature conditioning unit 720a and discharge hole 125b of second temperature conditioning unit 720b.

Switching unit 701 switches connection states of ducts 700, 700e, and 700f.

Rotation speed controller 702 controls either a rotation speed of electric motor 200a included in first temperature conditioning unit 720a or a rotation speed of electric motor 200b included in second temperature conditioning unit 720b.

Controller 703 controls switching unit 701 and rotation speed controller 702. Controller 703 controls flow paths or volumes of air flowing through the plurality of ducts 700, 700e, and 700f.

As illustrated in FIG. 21, temperature conditioning system 20b according to the present exemplary embodiment includes temperature conditioning unit 10a, first ducts 730, 730a, and 730b, second ducts 730c and 730d, switching units 701a and 701b, rotation speed controller 702, and controller 703.

Any of the temperature conditioning units described in the above exemplary embodiments can be used for temperature conditioning unit 10a.

Air flows through first ducts 730, 730a, and 730b without flowing through temperature conditioning unit 10a.

Air to be supplied to temperature conditioning unit 10a flows through second duct 730c. Air discharged from temperature conditioning unit 10a flows through second duct 730d.

Switching units 701a and 701b are connected to first and second ducts 730, 730a, 730b, 730c, and 730d. Switching units 701a and 701b switch the paths of air.

Rotation speed controller 702 controls a rotation speed of electric motor 200 included in temperature conditioning unit 10a.

Controller 703 controls switching units 701a and 701b and rotation speed controller 702. Controller 703 controls flow paths or volumes of air flowing through first and second ducts 730, 730a, 730b, 730c and 730d.

As illustrated in FIG. 22, vehicle 30 according to the present exemplary embodiment includes power source 800, driving wheels 801, travel controller 802, and temperature conditioning system 803.

Driving wheels 801 are driven by power supplied from power source 800. Travel controller 802 controls power source 800. Any of temperature conditioning systems 20, 20a, and 20b described above can be used for temperature conditioning system 803.

As illustrated in FIG. 23, vehicle 30a according to the present exemplary embodiment includes power source 800, driving wheels 801, travel controller 802, and temperature conditioning unit 804.

Driving wheels 801 are driven by power supplied from power source 800. Travel controller 802 controls power source 800. Any of the temperature conditioning units described in the above exemplary embodiments can be used for temperature conditioning unit 804.

A more detailed description will be given with reference to the drawings.

As illustrated in FIG. 22, temperature conditioning system 803 according to each exemplary embodiment is mounted on vehicle 30. If temperature conditioning system 803 is configured as described below when being mounted on vehicle 30, a member to be temperature-conditioned can be effectively cooled and heated.

Temperature conditioning system 803 according to the present exemplary embodiment can employ a plurality of the temperature conditioning units according to any of the exemplary embodiments described above. Temperature conditioning system 803 is provided with a plurality of ducts that connect air intake holes and air holes of the respective temperature conditioning units. Temperature conditioning system 803 is provided with a switching unit for changing volumes of air flowing through the ducts and switching flow paths of the air.

For example, when the air temperature on the intake side is lower than the ordinary temperature, a plurality of temperature conditioning units is connected using ducts. With this configuration, the member to be temperature-conditioned can be effectively temperature-conditioned.

Temperature conditioning system 803 according to the present exemplary embodiment has a plurality of ducts connected to air intake holes and air holes of the temperature conditioning units. The temperature conditioning system according to the present exemplary embodiment is provided with a switching unit for changing volumes of air flowing through the ducts and switching flow paths of the air.

For example, a plurality of ducts is connected to the air intake holes and the air holes of the temperature conditioning units according to the present exemplary embodiment.

One of the ducts has one end connected to the outside of the vehicle and the other end connected to the switching unit. One of the ducts has one end connected to the switching unit and the other end connected to the switching unit. One of the ducts has one end connected to the switching unit and the other end connected to the air intake hole of the temperature conditioning unit. One of the ducts has one end connected to the outlet hole of the temperature conditioning unit and the other end connected to the switching unit.

In the configuration described above, when the air temperature outside of vehicle 30 is within a predetermined range, the outside air can be directly taken into the interior of vehicle 30 via the duct. Moreover, when the air temperature outside of vehicle 30 is out of the predetermined range, the outside air can be taken into the interior of vehicle 30 via the duct and the temperature conditioning unit.

The temperature conditioning system according to the present exemplary embodiment is capable of switching air to be supplied to members to be temperature-conditioned, according to the temperature outside of the vehicle. Therefore, the temperature conditioning system according to the present exemplary embodiment can efficiently condition the temperature of the member to be temperature-conditioned, while achieving energy saving.

In the temperature conditioning system described above, the threshold of the air temperature outside of the vehicle for switching the ducts may be set, as appropriate, according to a purpose. Further, the temperature conditioning system described above may take in the air outside of the vehicle for switching the ducts according to atmospheric pressure, in place of the temperature outside of the vehicle.

The description of the configuration illustrated in FIG. 22 can be applied to the description of the configuration illustrated in FIG. 23 except that temperature conditioning system 803 in FIG. 22 is replaced by temperature conditioning system 804.

As described above, temperature conditioning system 20 according to the present exemplary embodiment includes two temperature conditioning units, one of the two temperature conditioning units being first temperature conditioning unit 711a and the other being second temperature conditioning unit 711b, the system including: a plurality of ducts 700, 700a, 700b, 700c, and 700d that connects first air hole part 906 or second air hole part 912 of first temperature conditioning unit 711a and first air hole part 906 or second air hole part 912 of second temperature conditioning unit 711b; switching unit 701 that switches connection states of the plurality of ducts 700, 700a, 700b, 700c, and 700d; rotation speed controller 702 that controls a rotation speed of electric motor 200a included in first temperature conditioning unit 711a or a rotation speed of electric motor 200b included in second temperature conditioning unit 711b; and controller 703 that controls switching unit 701 and rotation speed controller 702 to control flow paths of air flowing through the plurality of ducts 700, 700a, 700b, 700c, and 700d or a volume of the air.

Temperature conditioning system 20b according to the present exemplary embodiment includes temperature conditioning unit 10a, first ducts 730, 730a, and 730b through which air flows without flowing through temperature conditioning unit 10a; second ducts 730c and 730d through which air to be supplied to temperature conditioning unit 10a flows or through which air discharged from temperature conditioning unit 10a flows; switching units 701a and 701b that are connected to first and second ducts 730, 730a, 730b, 730c, and 730d and that switch paths of air; rotation speed controller 702 that controls a rotation speed of electric motor 200 included in temperature conditioning unit 10a; and controller 703 that controls switching units 701a and 701b and rotation speed controller 702 to control flow paths of air flowing through the plurality of ducts 730, 730a, 730b, 730c, and 730d or a volume of the air.

Vehicle 30 according to the present exemplary embodiment includes: power source 800; driving wheels 801 driven by power supplied from power source 800; travel controller 802 that controls power source 800; and temperature conditioning system 803.

Vehicle 30a according to the present exemplary embodiment includes: power source 800; driving wheels 801 driven by power supplied from power source 800; travel controller 802 that controls power source 800; and temperature conditioning unit 804.

INDUSTRIAL APPLICABILITY

The present invention can provide a temperature conditioning unit that can provide preferable cooling and heating even when the pressure resistance of the entire temperature conditioning unit increases due to an increase in density of objects housed in the temperature conditioning unit. Thus, the present invention is industrially valuable.

The invention claimed is:

1. A temperature conditioning unit including a first temperature conditioning unit part, a second temperature conditioning unit part, and a blower,
the first temperature conditioning unit part including a first housing, a first air hole part, a first air chamber, a first object to be temperature-conditioned, and a second air chamber,
the second temperature conditioning unit part including a second housing, a second object to be temperature-conditioned, a second air hole part, and a third air chamber,
the temperature conditioning unit comprising:
a partition wall formed such that a part of a wall of the first housing serves as a part of a wall of the second housing or a partition wall formed such that a part of the wall of the second housing serves as a part of the wall of the first housing;
an air path for connecting an air intake hole of the blower and the second air chamber so as to allow passage of air;
a structure for disposing an outlet hole of the blower in the third air chamber so as to allow passage of air;
a structure for disposing a part of the second object to be temperature-conditioned inside the third air chamber; and
a structure for disposing a part of the blower inside the third air chamber, wherein
the blower includes
an impeller disk that has a rotary shaft at a central portion and a surface extending in a direction intersecting the rotary shaft,
an impeller that has a plurality of rotor blades, each of the rotor blades extending in a direction along the rotary shaft, having a circular-arc cross section in the direction intersecting the rotary shaft, and having an inner-periphery-side end positioned closer to the rotary shaft and an outer-periphery-side end positioned on an opposite side from the rotary shaft, the circular-arc cross section protruding in a direction of rotation of the impeller disk,
an electric motor that includes a shaft and that transmits a rotary motion to the rotary shaft through the shaft,
a fan case that has a side wall extending in a longitudinal direction of the rotary shaft so as to cover the impeller and the air intake hole positioned in the longitudinal direction of the rotary shaft, and
an outlet hole corresponding to the air intake hole, and
the fan case has a flow path for guiding, toward the outlet hole along the side wall, air that is suctioned through the air intake hole and flows toward the outer-periphery-side end from the inner-periphery-side end due to rotation of the impeller by the rotary motion transmitted from the electric motor.

2. The temperature conditioning unit according to claim 1, wherein a plurality of the blowers is provided.

3. The temperature conditioning unit according to claim 1, wherein the first air hole part and the second air hole part have one or more holes.

4. The temperature conditioning unit according to claim 1, wherein the first object to be temperature-conditioned includes a secondary battery.

5. The temperature conditioning unit according to claim 1, wherein the second object to be temperature-conditioned includes a circuit board, an electronic component, a radiator, a relay, or a semiconductor element.

6. The temperature conditioning unit according to claim wherein
the fan case further has an inner wall surface that constitutes a part of the flow path and that faces the impeller, and
the inner wall surface has a curved part curving such that an extension line intersects an axis of the rotary shaft at an acute angle in a plane including the axis, the extension line extending from a line connecting a portion in proximity to the outer-periphery-side end and an edge of the outlet hole.

7. The temperature conditioning unit according to claim 1, wherein
the flow path further has a guide surface positioned to face the inner wall surface,
the guide surface having an inclined part inclined in a direction of the axis between a portion in proximity to the outer-periphery-side end and the outlet hole.

8. The temperature conditioning unit according to claim 1, wherein the impeller disk has a guide part inclined toward the outlet hole on an outer periphery of the impeller disk.

9. The temperature conditioning unit according to claim 1, wherein
the impeller further has a shroud that is positioned opposite to the impeller disk with respect to the plurality of rotor blades and that is connected to ends of the plurality of rotor blades opposite to the impeller disk,
the shroud has an opening formed at a position facing the air intake hole, and
a distance between the shroud and the impeller disk in a direction along the rotary shaft is shorter on a side of the outer-periphery-side end than on a side of the inner-periphery-side end.

10. The temperature conditioning unit according to claim 1, wherein, in a direction of rotation of the impeller, the inner-periphery-side end of each of the plurality of rotor blades is positioned forward of the outer-periphery-side end.

11. The temperature conditioning unit according to claim 1, wherein the impeller further has a plurality of stator blades protruding forward from an outer periphery of the impeller disk in a direction of rotation of the impeller.

12. The temperature conditioning unit according to claim 1, wherein
the impeller has a diffuser including
a diffuser plate positioned parallel to the impeller disk, and
a plurality of stator blades extending in the direction along the rotary shaft on a surface of the diffuser plate on a side of the air intake hole,
the plurality of stator blades protruding forward from an outer periphery of the impeller disk in a direction of rotation of the impeller.

13. A temperature conditioning system including two of the temperature conditioning units according to claim 1, one of the two temperature conditioning units being a first temperature conditioning unit and another being a second temperature conditioning unit,
the system comprising:
a plurality of ducts that connects the first air hole part or the second air hole part of the first temperature conditioning unit and the first air hole part or the second air hole part of the second temperature conditioning unit;
a switching unit that switches connection states of the plurality of ducts;
a rotation speed controller that controls a rotation speed of the electric motor included in the first temperature conditioning unit or a rotation speed of the electric motor included in the second temperature conditioning unit; and
a controller that controls the switching unit and the rotation speed controller to control flow paths of air flowing through the plurality of ducts or a volume of the air.

14. A temperature conditioning system comprising:
the temperature conditioning unit according to claim 1,
a first duct that causes air to flow without flowing through the temperature conditioning unit;
a second duct that causes the air to be supplied to the temperature conditioning unit to flow or that causes the air discharged from the temperature conditioning unit to flow;
a switching unit that is connected to the first duct and the second duct and that switches paths of the air;
a rotation speed controller that controls a rotation speed of the electric motor included in the temperature conditioning unit; and
a controller that controls the switching unit and the rotation speed controller to control flow paths of air flowing through the plurality of ducts or a volume of the air.

15. A vehicle comprising:
a power source;
a driving wheel driven by power supplied from the power source;
a travel controller that controls the power source; and
the temperature conditioning system according to claim 13.

16. A vehicle comprising:
a power source;
a driving wheel driven by power supplied from the power source;
a travel controller that controls the power source; and
the temperature conditioning system according to claim 14.

17. A vehicle comprising:
a power source;
a driving wheel driven by power supplied from the power source;
a travel controller that controls the power source; and
the temperature conditioning unit according to claim 1.

18. A temperature conditioning unit including a first temperature conditioning unit part, a second temperature conditioning unit part, and a blower,
the first temperature conditioning unit part including a first housing, a first air hole part, a first air chamber, a first object to be temperature-conditioned, and a second air chamber,
the second temperature conditioning unit part including a second housing, a second object to be temperature-conditioned, a second air hole part, and a third air chamber,
the temperature conditioning unit comprising:
a partition wall formed such that a part of a wall of the first housing serves as a part of a wall of the second housing or a partition wall formed such that a part of the wall of the second housing serves as a part of the wall of the first housing;
an air path for connecting an outlet hole of the blower and the second air chamber so as to allow passage of air;
a structure for disposing an air intake hole of the blower in the third air chamber so as to allow passage of air;
a structure for disposing a part of the second object to be temperature-conditioned inside the third air chamber; and
a structure for disposing a part of the blower inside the third air chamber, wherein
the blower includes
an impeller disk that has a rotary shaft at a central portion and a surface extending in a direction intersecting the rotary shaft,
an impeller that has a plurality of rotor blades, each of the rotor blades extending in a direction along the rotary shaft, having a circular-arc cross section in the direction intersecting the rotary shaft, and having an inner-periphery-side end positioned closer to the rotary shaft and an outer-periphery-side end positioned on an opposite side from the rotary shaft, the circular-arc cross-section protruding in a direction of rotation of the impeller disk,
an electric motor that includes a shaft and that transmits a rotary motion to the rotary shaft through the shaft,
a fan case that has a side wall extending in a longitudinal direction of the rotary shaft so as to cover the impeller and the air intake hole positioned in the longitudinal direction of the rotary shaft, and
an outlet hole corresponding to the air intake hole, and
the fan case has a flow path for guiding, toward the outlet hole along the side wall, air that is suctioned through the air intake hole and flows toward the outer-periphery-side end from the inner-periphery-side end due to rotation of the impeller by the rotary motion transmitted from the electric motor.

* * * * *